US012334351B2

(12) United States Patent
Na et al.

(10) Patent No.: US 12,334,351 B2
(45) Date of Patent: Jun. 17, 2025

(54) MOLYBDENUM DEPOSITION

(71) Applicant: Lam Research Corporation, Fremont, CA (US)

(72) Inventors: Jeong-Seok Na, San Jose, CA (US); Yao-Tsung Hsieh, San Jose, CA (US); Chiukin Steven Lai, Sunnyvale, CA (US); Patrick A. Van Cleemput, Duvall, WA (US)

(73) Assignee: Lam Research Corporation, Fremont, CA (US)

( * ) Notice: Subject to any disclaimer, the term of this patent is extended or adjusted under 35 U.S.C. 154(b) by 382 days.

(21) Appl. No.: 17/639,846

(22) PCT Filed: Sep. 1, 2020

(86) PCT No.: PCT/US2020/048951
§ 371 (c)(1),
(2) Date: Mar. 2, 2022

(87) PCT Pub. No.: WO2021/046058
PCT Pub. Date: Mar. 11, 2021

(65) Prior Publication Data
US 2022/0328317 A1    Oct. 13, 2022

Related U.S. Application Data

(60) Provisional application No. 62/895,407, filed on Sep. 3, 2019.

(51) Int. Cl.
*H01L 21/285* (2006.01)
*C23C 16/02* (2006.01)
(Continued)

(52) U.S. Cl.
CPC .... *H01L 21/28568* (2013.01); *C23C 16/0245* (2013.01); *C23C 16/045* (2013.01);
(Continued)

(58) Field of Classification Search
CPC .................................................. H01L 21/0228
See application file for complete search history.

(56) References Cited

U.S. PATENT DOCUMENTS

| 1,012,671 | A | 12/1911 | Long |
| 5,502,005 | A | 3/1996 | Mikagi |

(Continued)

FOREIGN PATENT DOCUMENTS

| CN | 1332267 A | 1/2002 |
| CN | 1675402 A | 9/2005 |

(Continued)

OTHER PUBLICATIONS

Chinese First Office Action dated Jan. 4, 2021 issued in Application No. CN 201710700258.6.

(Continued)

*Primary Examiner* — Yu-Hsi D Sun
(74) *Attorney, Agent, or Firm* — Weaver Austin Villeneuve & Sampson LLP

(57) ABSTRACT

Provided are methods of filling patterned features with molybdenum (Mo). The methods involve selective deposition of Mo films on bottom metal-containing surfaces of a feature including dielectric sidewalls. The selective growth of Mo on the bottom surface allows bottom-up growth and high quality, void-free fill. Also provided are related apparatus.

18 Claims, 10 Drawing Sheets

(51) Int. Cl.
*C23C 16/04* (2006.01)
*C23C 16/08* (2006.01)
*C23C 16/455* (2006.01)
*H01L 21/768* (2006.01)

(52) U.S. Cl.
CPC ........ *C23C 16/08* (2013.01); *C23C 16/45553* (2013.01); *H01L 21/76879* (2013.01)

(56) References Cited

U.S. PATENT DOCUMENTS

| | | | |
|---|---|---|---|
| 5,612,254 A * | 3/1997 | Mu | H01L 21/76807 257/E21.585 |
| 5,643,394 A | 7/1997 | Maydan et al. | |
| 5,863,836 A | 1/1999 | Jones | |
| 6,103,609 A | 8/2000 | Lee et al. | |
| 6,271,084 B1 | 8/2001 | Tu et al. | |
| 6,284,653 B1 | 9/2001 | Tseng | |
| 6,306,216 B1 | 10/2001 | Kim, II et al. | |
| 6,359,160 B1 | 3/2002 | Sun et al. | |
| 6,635,965 B1 | 10/2003 | Lee et al. | |
| 6,794,287 B2 | 9/2004 | Saanila et al. | |
| 6,844,258 B1 | 1/2005 | Fair et al. | |
| 6,958,174 B1 | 10/2005 | Klaus et al. | |
| 7,005,372 B2 | 2/2006 | Levy et al. | |
| 7,141,494 B2 | 11/2006 | Lee et al. | |
| 7,250,367 B2 | 7/2007 | Vaartstra et al. | |
| 7,262,125 B2 | 8/2007 | Wongsenakhum et al. | |
| 7,560,581 B2 | 7/2009 | Gordon et al. | |
| 7,589,017 B2 | 9/2009 | Chan et al. | |
| 7,691,749 B2 | 4/2010 | Levy et al. | |
| 7,772,114 B2 | 8/2010 | Chan et al. | |
| 7,955,972 B2 | 6/2011 | Chan et al. | |
| 8,053,365 B2 | 11/2011 | Humayun et al. | |
| 8,058,170 B2 | 11/2011 | Chandrashekar et al. | |
| 8,089,128 B2 | 1/2012 | Ramaswamy et al. | |
| 8,101,521 B1 | 1/2012 | Gao et al. | |
| 8,278,216 B1 | 10/2012 | Alers et al. | |
| 9,076,646 B2 | 7/2015 | Sims et al. | |
| 9,082,826 B2 | 7/2015 | Chandrashekar et al. | |
| 9,159,571 B2 | 10/2015 | Humayun et al. | |
| 9,175,023 B2 | 11/2015 | Odedra et al. | |
| 9,236,297 B2 | 1/2016 | Chen et al. | |
| 9,548,266 B2 | 1/2017 | Ajuria et al. | |
| 9,583,385 B2 | 2/2017 | Lee et al. | |
| 9,595,470 B2 | 3/2017 | Bamnolker et al. | |
| 9,613,818 B2 | 4/2017 | Ba et al. | |
| 9,653,353 B2 | 5/2017 | Chandrashekar et al. | |
| 9,659,998 B1 | 5/2017 | Lung | |
| 9,899,372 B1 | 2/2018 | Bi et al. | |
| 9,978,605 B2 | 5/2018 | Bamnolker et al. | |
| 10,079,144 B2 | 9/2018 | Kim et al. | |
| 10,094,021 B2 | 10/2018 | Lansalot-Matras et al. | |
| 10,121,671 B2 | 11/2018 | Fu et al. | |
| 10,283,404 B2 | 5/2019 | Na et al. | |
| 10,395,984 B2 | 8/2019 | Backes et al. | |
| 10,505,111 B1 | 12/2019 | Ok et al. | |
| 10,510,590 B2 | 12/2019 | Thombare et al. | |
| 10,510,951 B1 | 12/2019 | Yu et al. | |
| 10,566,211 B2 | 2/2020 | Chandrashekar et al. | |
| 10,573,522 B2 | 2/2020 | Jandl et al. | |
| 10,622,375 B2 | 4/2020 | Chun et al. | |
| 10,643,826 B2 | 5/2020 | Kim et al. | |
| 10,643,904 B2 | 5/2020 | Xie et al. | |
| 10,731,250 B2 | 8/2020 | Kim et al. | |
| 10,734,238 B2 | 8/2020 | Zhou et al. | |
| 10,777,453 B2 | 9/2020 | Thombare et al. | |
| 10,995,405 B2 | 5/2021 | Dezelah et al. | |
| 11,211,253 B2 | 12/2021 | Zhou et al. | |
| 11,355,345 B2 | 6/2022 | Jandl et al. | |
| 11,549,175 B2 | 1/2023 | Butail et al. | |
| 11,821,071 B2 | 11/2023 | Blakeney | |
| 11,970,776 B2 | 4/2024 | Collins et al. | |
| 12,074,029 B2 | 8/2024 | Van Cleemput et al. | |
| 12,148,623 B2 | 11/2024 | Van Cleemput et al. | |
| 2001/0002326 A1 | 5/2001 | Yang et al. | |
| 2002/0009872 A1 | 1/2002 | Hoshino et al. | |
| 2002/0024140 A1 | 2/2002 | Nakajima et al. | |
| 2002/0045355 A1 | 4/2002 | Chong et al. | |
| 2003/0019428 A1 | 1/2003 | Ku et al. | |
| 2003/0082296 A1 | 5/2003 | Elers et al. | |
| 2003/0194825 A1 | 10/2003 | Law et al. | |
| 2003/0209193 A1 | 11/2003 | Van Wijck | |
| 2004/0087143 A1 | 5/2004 | Norman et al. | |
| 2004/0202786 A1 | 10/2004 | Wongsenakhum et al. | |
| 2005/0031786 A1 | 2/2005 | Lee et al. | |
| 2005/0186342 A1 | 8/2005 | Sager et al. | |
| 2005/0212139 A1 | 9/2005 | Leinikka et al. | |
| 2005/0277296 A1 | 12/2005 | Adetutu et al. | |
| 2005/0282384 A1 | 12/2005 | Nawafune et al. | |
| 2006/0040052 A1 | 2/2006 | Fang et al. | |
| 2006/0046521 A1 | 3/2006 | Vaartstra et al. | |
| 2006/0102950 A1 | 5/2006 | Takebuchi et al. | |
| 2006/0115590 A1 | 6/2006 | Suzuki et al. | |
| 2007/0009658 A1 | 1/2007 | Yoo et al. | |
| 2007/0066060 A1 | 3/2007 | Wang | |
| 2007/0077712 A1 | 4/2007 | Joo et al. | |
| 2007/0215852 A1 | 9/2007 | Lung | |
| 2007/0232015 A1 | 10/2007 | Liu | |
| 2008/0014352 A1 | 1/2008 | Xi et al. | |
| 2008/0061282 A1 | 3/2008 | Sato et al. | |
| 2008/0116437 A1 | 5/2008 | Oh et al. | |
| 2008/0124926 A1 | 5/2008 | Chan et al. | |
| 2008/0170984 A1 | 7/2008 | Tenne et al. | |
| 2008/0197335 A1 | 8/2008 | Yu | |
| 2008/0206987 A1 | 8/2008 | Gelatos et al. | |
| 2008/0227291 A1 | 9/2008 | Lai et al. | |
| 2008/0254623 A1 | 10/2008 | Chan et al. | |
| 2008/0268642 A1 | 10/2008 | Yanagita et al. | |
| 2008/0280390 A1 | 11/2008 | Kim et al. | |
| 2008/0303014 A1 | 12/2008 | Goux et al. | |
| 2008/0317972 A1 | 12/2008 | Hendriks et al. | |
| 2009/0004848 A1 | 1/2009 | Kim et al. | |
| 2009/0053893 A1 | 2/2009 | Khandelwal et al. | |
| 2009/0081374 A1 | 3/2009 | Yang et al. | |
| 2009/0149022 A1 | 6/2009 | Chan et al. | |
| 2009/0212280 A1 | 8/2009 | Werner et al. | |
| 2009/0239368 A1 | 9/2009 | Park et al. | |
| 2009/0304914 A1 | 12/2009 | Nalla et al. | |
| 2010/0107927 A1 | 5/2010 | Stewart et al. | |
| 2010/0159694 A1 | 6/2010 | Chandrashekar et al. | |
| 2010/0167527 A1 | 7/2010 | Wu et al. | |
| 2010/0168404 A1 | 7/2010 | Girolami et al. | |
| 2010/0176512 A1 * | 7/2010 | Yang | H01L 21/76834 257/774 |
| 2010/0207245 A1 | 8/2010 | Cheng et al. | |
| 2010/0213541 A1 | 8/2010 | Jeon et al. | |
| 2010/0320607 A1 | 12/2010 | Suzuki | |
| 2011/0020546 A1 | 1/2011 | Hamalainen et al. | |
| 2011/0021024 A1 | 1/2011 | Calvo-Munoz et al. | |
| 2011/0146568 A1 | 6/2011 | Haukka et al. | |
| 2011/0151615 A1 | 6/2011 | Gordon et al. | |
| 2011/0155993 A1 | 6/2011 | Chen | |
| 2011/0223763 A1 | 9/2011 | Chan et al. | |
| 2011/0256645 A1 | 10/2011 | Tam et al. | |
| 2011/0287184 A1 | 11/2011 | Shenai-Khatkhate et al. | |
| 2012/0045589 A1 | 2/2012 | Ivanov et al. | |
| 2012/0119177 A1 | 5/2012 | Erbetta | |
| 2012/0187305 A1 | 7/2012 | Elam et al. | |
| 2012/0231626 A1 | 9/2012 | Lee et al. | |
| 2012/0305872 A1 | 12/2012 | Yoon | |
| 2013/0109172 A1 | 5/2013 | Collins et al. | |
| 2013/0164928 A1 | 6/2013 | Lim et al. | |
| 2013/0189837 A1 | 7/2013 | Haukka et al. | |
| 2013/0270703 A1 | 10/2013 | Zierath et al. | |
| 2013/0302980 A1 | 11/2013 | Chandrashekar et al. | |
| 2014/0106083 A1 | 4/2014 | Wu et al. | |
| 2014/0138604 A1 | 5/2014 | Liu et al. | |
| 2014/0147589 A1 | 5/2014 | Khandelwal et al. | |
| 2014/0217590 A1 | 8/2014 | Nalla et al. | |
| 2014/0370192 A1 | 12/2014 | Odedra et al. | |
| 2015/0170961 A1 | 6/2015 | Romero et al. | |
| 2015/0179461 A1 | 6/2015 | Bamnolker et al. | |
| 2015/0262939 A1 | 9/2015 | Sakata | |

(56) References Cited

U.S. PATENT DOCUMENTS

| | | |
|---|---|---|
| 2015/0325475 A1 | 11/2015 | Bamnolker et al. |
| 2015/0348840 A1 | 12/2015 | Bamnolker et al. |
| 2015/0354064 A1 | 12/2015 | Kolics et al. |
| 2016/0027614 A1 | 1/2016 | Manna et al. |
| 2016/0040289 A1 | 2/2016 | Gatineau et al. |
| 2016/0056074 A1 | 2/2016 | Na et al. |
| 2016/0064409 A1 | 3/2016 | Yaegashi |
| 2016/0077435 A1 | 3/2016 | Ban et al. |
| 2016/0104624 A1 | 4/2016 | Fu et al. |
| 2016/0109800 A1 | 4/2016 | Bae et al. |
| 2016/0118345 A1 | 4/2016 | Chen et al. |
| 2016/0141419 A1 | 5/2016 | Baenninger et al. |
| 2016/0168699 A1 | 6/2016 | Fukazawa et al. |
| 2016/0172211 A1 | 6/2016 | Demos et al. |
| 2016/0181272 A1 | 6/2016 | Rabkin et al. |
| 2016/0225632 A1 | 8/2016 | Shaikh et al. |
| 2016/0300952 A1 | 10/2016 | Toriumi et al. |
| 2016/0309596 A1 | 10/2016 | Shaviv et al. |
| 2016/0343612 A1 | 11/2016 | Wang et al. |
| 2016/0351401 A1 | 12/2016 | Ba et al. |
| 2016/0351444 A1 | 12/2016 | Schloss et al. |
| 2017/0040214 A1 | 2/2017 | Lai et al. |
| 2017/0062224 A1 | 3/2017 | Fu et al. |
| 2017/0062714 A1 | 3/2017 | Kau |
| 2017/0069527 A1 | 3/2017 | Haukka et al. |
| 2017/0117155 A1 | 4/2017 | Bamnolker et al. |
| 2017/0125548 A1 | 5/2017 | Hung et al. |
| 2017/0229341 A1 | 8/2017 | Chang et al. |
| 2017/0268107 A1 | 9/2017 | Lansalot-Matras et al. |
| 2017/0294381 A1 | 10/2017 | Briggs et al. |
| 2017/0306479 A1 | 10/2017 | Raisanen et al. |
| 2017/0306490 A1 | 10/2017 | Chan et al. |
| 2017/0350008 A1 | 12/2017 | Collins et al. |
| 2017/0358482 A1 | 12/2017 | Chen et al. |
| 2018/0019165 A1 | 1/2018 | Baum et al. |
| 2018/0053660 A1 | 2/2018 | Jandl et al. |
| 2018/0142345 A1 | 5/2018 | Meng et al. |
| 2018/0151497 A1 | 5/2018 | Makala et al. |
| 2018/0166276 A1 | 6/2018 | Nakao et al. |
| 2018/0240675 A1 | 8/2018 | Bamnolker et al. |
| 2018/0240676 A1 | 8/2018 | Chan et al. |
| 2018/0247832 A1 | 8/2018 | Fischer et al. |
| 2018/0261503 A1 | 9/2018 | Meng et al. |
| 2018/0286668 A1 | 10/2018 | Baum et al. |
| 2018/0294187 A1 | 10/2018 | Thombare et al. |
| 2018/0342390 A1 | 11/2018 | Xiao et al. |
| 2018/0355484 A1 | 12/2018 | Lansalot-Matras et al. |
| 2019/0003050 A1 | 1/2019 | Dezelah et al. |
| 2019/0006226 A1 | 1/2019 | Khare et al. |
| 2019/0019725 A1 | 1/2019 | Chandrashekar et al. |
| 2019/0067003 A1 | 2/2019 | Zope et al. |
| 2019/0067014 A1 | 2/2019 | Shrestha et al. |
| 2019/0067094 A1 | 2/2019 | Zope et al. |
| 2019/0088474 A1 | 3/2019 | Macdonald et al. |
| 2019/0088555 A1 | 3/2019 | Xie et al. |
| 2019/0157102 A1 | 5/2019 | Jian et al. |
| 2019/0157141 A1 | 5/2019 | Liao et al. |
| 2019/0161853 A1 | 5/2019 | Aoyama et al. |
| 2019/0177838 A1 | 6/2019 | Cadot et al. |
| 2019/0189456 A1 | 6/2019 | Mullick et al. |
| 2019/0189688 A1 | 6/2019 | Lille |
| 2019/0226086 A1 | 7/2019 | Wright, Jr. et al. |
| 2019/0256467 A1 | 8/2019 | Anthis et al. |
| 2019/0273019 A1 | 9/2019 | Mullick et al. |
| 2019/0368039 A1 | 12/2019 | Arteaga et al. |
| 2019/0371662 A1 | 12/2019 | Chen et al. |
| 2020/0006073 A1 | 1/2020 | Smith et al. |
| 2020/0010954 A1 | 1/2020 | Bhuyan et al. |
| 2020/0075403 A1 | 3/2020 | Thombare et al. |
| 2020/0105515 A1 | 4/2020 | Maes et al. |
| 2020/0111675 A1 | 4/2020 | Takatsuki et al. |
| 2020/0144066 A1 | 5/2020 | Jandl et al. |
| 2020/0152870 A1 | 5/2020 | Lin et al. |
| 2020/0194670 A1 | 6/2020 | Allegra |
| 2020/0199743 A1* | 6/2020 | Wright, Jr. ............... C23C 16/50 |
| 2020/0219933 A1 | 7/2020 | Cheng |
| 2020/0227275 A1 | 7/2020 | Mullick et al. |
| 2020/0242209 A1 | 7/2020 | Bowes et al. |
| 2020/0332416 A1 | 10/2020 | Fluit |
| 2020/0343136 A1 | 10/2020 | Yu et al. |
| 2020/0365456 A1 | 11/2020 | Thombare et al. |
| 2020/0402846 A1 | 12/2020 | Collins et al. |
| 2021/0047726 A1 | 2/2021 | Liu et al. |
| 2021/0057223 A1 | 2/2021 | Stevens et al. |
| 2021/0082750 A1 | 3/2021 | Yu et al. |
| 2021/0098532 A1 | 4/2021 | Wu |
| 2021/0123136 A1 | 4/2021 | Kalutarage et al. |
| 2021/0140043 A1 | 5/2021 | Thombare et al. |
| 2021/0151352 A1 | 5/2021 | Zope et al. |
| 2021/0238736 A1 | 8/2021 | Butail et al. |
| 2021/0277517 A1 | 9/2021 | Liu et al. |
| 2021/0285102 A1 | 9/2021 | Yoon et al. |
| 2021/0313183 A1 | 10/2021 | Ba et al. |
| 2021/0320034 A1 | 10/2021 | Lei et al. |
| 2021/0348271 A1 | 11/2021 | Mishra et al. |
| 2021/0407809 A1 | 12/2021 | Zope et al. |
| 2022/0013365 A1 | 1/2022 | Van Cleemput et al. |
| 2022/0018017 A1 | 1/2022 | Kim et al. |
| 2022/0037163 A1 | 2/2022 | Yang et al. |
| 2022/0044929 A1 | 2/2022 | Xiao et al. |
| 2022/0139713 A1 | 5/2022 | Färm et al. |
| 2022/0170155 A1 | 6/2022 | Blakeney |
| 2022/0195598 A1 | 6/2022 | Collins et al. |
| 2022/0220136 A1 | 7/2022 | Leoncini et al. |
| 2022/0220139 A1 | 7/2022 | Leoncini et al. |
| 2022/0220607 A1 | 7/2022 | Leoncini et al. |
| 2022/0223471 A1 | 7/2022 | Thombare et al. |
| 2022/0262640 A1 | 8/2022 | Jandl et al. |
| 2022/0285211 A1 | 9/2022 | Färm et al. |
| 2022/0298624 A1 | 9/2022 | Blakeney et al. |
| 2022/0325410 A1 | 10/2022 | Yoon et al. |
| 2022/0356579 A1 | 11/2022 | Collins et al. |
| 2022/0359211 A1 | 11/2022 | Van Cleemput et al. |
| 2022/0375792 A1 | 11/2022 | Schloss et al. |
| 2022/0389579 A1 | 12/2022 | Thombare et al. |
| 2023/0290680 A1 | 9/2023 | Collins et al. |
| 2023/0326790 A1 | 10/2023 | Tarafdar et al. |
| 2024/0052486 A1 | 2/2024 | Blakeney |
| 2024/0136192 A1 | 4/2024 | Schloss et al. |
| 2024/0234152 A9 | 7/2024 | Schloss et al. |
| 2024/0271281 A1 | 8/2024 | Collins et al. |
| 2024/0297075 A1 | 9/2024 | Thombare et al. |
| 2024/0401196 A1 | 12/2024 | Thombare et al. |

FOREIGN PATENT DOCUMENTS

| | | |
|---|---|---|
| CN | 1957446 A | 5/2007 |
| CN | 101308794 A | 11/2008 |
| CN | 101752299 A | 6/2010 |
| CN | 102206387 A | 10/2011 |
| CN | 102206387 B | 4/2014 |
| CN | 104752339 A | 7/2015 |
| CN | 105097446 A | 11/2015 |
| CN | 105280549 A | 1/2016 |
| CN | 106575626 A | 4/2017 |
| CN | 107305838 A | 10/2017 |
| CN | 107710443 A | 2/2018 |
| CN | 107768304 A | 3/2018 |
| CN | 109072424 A | 12/2018 |
| CN | 109563621 A | 4/2019 |
| CN | 109661481 A | 4/2019 |
| EP | 1167567 A1 | 1/2002 |
| EP | 1728894 A1 | 12/2006 |
| EP | 1806352 A1 | 7/2007 |
| JP | S595246 A | 1/1984 |
| JP | H02231714 A | 9/1990 |
| JP | H11238736 A | 8/1999 |
| JP | 2001172049 A | 6/2001 |
| JP | 2001257177 A | 9/2001 |
| JP | 2001274105 A | 10/2001 |
| JP | 2001284360 A | 10/2001 |
| JP | 2003528215 A | 9/2003 |
| JP | 2005150416 A | 6/2005 |
| JP | 2006511716 A | 4/2006 |

(56) References Cited

FOREIGN PATENT DOCUMENTS

| | | |
|---|---|---|
| JP | 2007019375 A | 1/2007 |
| JP | 2007182443 A | 7/2007 |
| JP | 2008205219 A | 9/2008 |
| JP | 2008211183 A | 9/2008 |
| JP | 2011035366 A | 2/2011 |
| JP | 2012246531 A | 12/2012 |
| JP | 2014074190 A | 4/2014 |
| JP | 2014511380 A | 5/2014 |
| JP | 2015021175 A | 2/2015 |
| JP | 2016098406 A | 5/2016 |
| JP | 2016516892 A | 6/2016 |
| JP | 2016164131 A | 9/2016 |
| JP | 2017053024 A | 3/2017 |
| JP | 2017525156 A | 8/2017 |
| JP | 2018035375 A | 3/2018 |
| JP | 2019044266 A | 3/2019 |
| JP | 2019527302 A | 9/2019 |
| JP | 2019186508 A | 10/2019 |
| JP | 2020029618 A | 2/2020 |
| JP | 2020513065 A | 4/2020 |
| JP | 2021523983 A | 9/2021 |
| JP | 2021535575 A | 12/2021 |
| JP | 7485736 B2 | 5/2024 |
| KR | 0138381 B1 | 6/1998 |
| KR | 20030043201 A | 6/2003 |
| KR | 100477840 B1 | 6/2005 |
| KR | 20050054122 A | 6/2005 |
| KR | 20100068845 A | 6/2010 |
| KR | 20100096488 A | 9/2010 |
| KR | 20110024932 A | 3/2011 |
| KR | 20150063562 A | 6/2015 |
| KR | 20150077376 A | 7/2015 |
| KR | 20150108780 A | 9/2015 |
| KR | 20150128615 A | 11/2015 |
| KR | 20160098986 A | 8/2016 |
| KR | 101745074 B1 | 6/2017 |
| KR | 20170095801 A | 8/2017 |
| KR | 20180019487 A | 2/2018 |
| KR | 20190024834 A | 3/2019 |
| KR | 20190130046 A | 11/2019 |
| KR | 20200056543 A | 5/2020 |
| KR | 20200090108 A | 7/2020 |
| KR | 20210156444 A | 12/2021 |
| TW | 201123305 A | 7/2011 |
| TW | 201542857 A | 11/2015 |
| TW | 201705490 A | 2/2017 |
| TW | 201710543 A | 3/2017 |
| TW | 201738405 A | 11/2017 |
| TW | 201741325 A | 12/2017 |
| TW | 201812069 A | 4/2018 |
| TW | 201812070 A | 4/2018 |
| TW | 201907037 A | 2/2019 |
| TW | 201920740 A | 6/2019 |
| WO | WO-2006036865 A2 | 4/2006 |
| WO | WO-2007005088 A2 | 1/2007 |
| WO | WO-2012047591 A1 | 4/2012 |
| WO | WO-2014052642 A1 | 4/2014 |
| WO | WO-2015023404 A1 | 2/2015 |
| WO | WO-2016191432 A1 | 12/2016 |
| WO | WO-2017070634 A1 | 4/2017 |
| WO | WO-2017091571 A1 | 6/2017 |
| WO | WO-2017143246 A1 | 8/2017 |
| WO | WO-2018191183 A1 | 10/2018 |
| WO | WO-2019099233 A1 | 5/2019 |
| WO | WO-2019232344 A1 | 12/2019 |
| WO | WO-2020023790 A1 | 1/2020 |
| WO | WO-2020028587 A1 | 2/2020 |
| WO | WO-2020106649 A1 | 5/2020 |
| WO | WO-2020185618 A1 | 9/2020 |
| WO | WO-2021035236 A1 | 2/2021 |
| WO | WO-2021046058 A1 | 3/2021 |
| WO | WO-2021076636 A1 | 4/2021 |
| WO | WO-2021178399 A1 | 9/2021 |
| WO | WO-2021237032 A1 | 11/2021 |
| WO | WO-2022108762 A1 | 5/2022 |
| WO | WO-2022150270 A1 | 7/2022 |
| WO | WO-2022221210 A1 | 10/2022 |
| WO | WO-2023114648 A1 | 6/2023 |

OTHER PUBLICATIONS

Chinese Second Office Action dated Jun. 17, 2021 issued in Application No. CN 201710700258.6.
Final Office Action dated May 23, 2019 issued in U.S. Appl. No. 15/948,143.
Final Office Action dated Sep. 2, 2021 issued in U.S. Appl. No. 16/947,286.
International Preliminary Report on Patentability dated Aug. 12, 2021, issued in Application No. PCT/US2020/015241.
International Preliminary Report on Patentability dated Feb. 4, 2021 in Application No. PCT/US2019/043514.
International Preliminary Report on Patentability dated Jun. 3, 2021 in Application No. PCT/US2019/062067.
International Preliminary Report on Patentability dated Jun. 4, 2020 in Application No. PCT/US2018/061803.
International Preliminary Report on Patentability dated Nov. 12, 2020 in Application No. PCT/US2019/030712.
International Preliminary Report on Patentability dated Oct. 24, 2019 in Application No. PCT/US2018/026746.
International Preliminary Report on Patentability dated Sep. 23, 2021 issued in Application No. PCT/US2020/021543.
International Search Report and Written Opinion dated Aug. 19, 2019 in Application No. PCT/US2019/030712.
International Search Report and Written Opinion dated Dec. 4, 2020, in PCT Application No. PCT/US2020/048951.
International Search Report and Written Opinion dated Jul. 1, 2020 in Application No. PCT/US2020/021543.
International Search Report and Written Opinion dated Jul. 27, 2018 in Application No. PCT/US2018/026746.
International Search Report and Written Opinion dated Jun. 3, 2020, issued in Application No. PCT/US2020/015241.
International Search Report and Written Opinion dated Mar. 8, 2019 in Application No. PCT/US2018/061803.
International Search Report and Written Opinion dated Mar. 9, 2020 in Application No. PCT/US2019/062067.
International Search Report and Written Opinion dated Nov. 11, 2019 in Application No. PCT/US2019/043514.
International Search Report and Written Opinion dated Nov. 11, 2020 issued in Application No. PCT/US2020/070434.
Jamie, W. et al., "In Situ Atomic Layer Deposition and Electron Tunneling Characterization of Monolayer $Al_2O_3$ on Fe for Magnetic Tunnel Junctions", AIP Advances, 2018, vol. 8, No. 125218, pp. 1-9.
Johnson, R.W., Hultqvist, A., Bent, S.F., "A brief review of atomic layer deposition: from fundamentals to applications", Materials today, (Jun. 1, 2014), 17(5):236-46.
KR Office Action dated Feb. 21, 2022, in Application No. KR10-2017-0102113.
Kurek et al. "Recent advances using guanidinate ligands for chemical vapour deposition (CVD) and atomic layer deposition (ALD) applications," Australian Journal of Chemistry, vol. 67, Jun. 2014, pp. 989-996.
Li, Z et al., "Atomic Layer Deposition of Ultrathin Copper Metal Films from a Liquid Copper(I) Amidinate Precursor", Journal of The Electrochemical Society, 2006, vol. 153, No. 11, pp. C787-C794.
Lim, B. et al., "Atomic Layer Deposition of Transition Metals", Nature Materials, 2003, vol. 2, pp. 749-754.
Majumder et al. "Investigation on the diffusion barrier properties of sputtered Mo/W-N thin films in Cu interconnects," Applied Physics Letters, vol. 91 (2007), p. 162108-1-162108-3.
Notice of Allowance dated Apr. 27, 2020 issued in U.S. Appl. No. 16/676,169.
Notice of Allowance dated Aug. 6, 2019 issued in U.S. Appl. No. 15/948,143.
Office Action dated Apr. 27, 2021 issued in U.S. Appl. No. 16/947,286.

(56) References Cited

OTHER PUBLICATIONS

Office Action dated Aug. 12, 2021 issued in U.S. Appl. No. 16/764,812.
Office Action dated Feb. 4, 2019 issued in U.S. Appl.No. 15/948,143.
Office Action Requirement for Restriction/Election dated Sep. 22, 2021 issued in U.S. Appl. No. 17/250,452.
Otsuka et al. A novel molybdenum thiolato compound, tetrakis (tertbutylthilolato molybdenum(IV), preparation and crystal and molecular structure Journal of American chemistry society, 1981, pp. 3011-3014.
Specification of U.S. Appl. No. 62/425,704 (Electronically Filed on Nov. 23, 2016).
TW Office Action dated Oct. 18, 2021, in application No. TW107112210 with English translation.
U.S. Corrected Notice of Allowance dated Feb. 16, 2022, in U.S. Appl. No. 16/724,231.
U.S. Final Office Action dated Jan. 31, 2022 in U.S. Appl. No. 16/764,812.
U.S. Final Office Action dated Mar. 29, 2021 issued in U.S. Appl. No. 16/724,231.
U.S. Non-Final Office Action dated Dec. 15, 2021 in U.S. Appl. No. 17/250,014.
U.S. Non-Final Office Action dated Nov. 19, 2021, in U.S. Appl. No. 17/250,452.
U.S. Notice of Allowance dated Feb. 2, 2022 in U.S. Appl. No. 16/724,231.
U.S. Notice of allowance dated Sep. 29, 2021 issued in U.S. Appl. No. 16/724,231.
U.S. Office Action dated Sep. 22, 2020 issued in U.S. Appl. No. 16/724,231.
U.S. Office Action Restriction/Election dated Sep. 9, 2021 issued in U.S. Appl. No. 17/250,014.
U.S. Appl. No. 17/294,378, inventors van Cleemput et al., filed on May 14, 2021.
U.S. Appl. No. 17/310,293, inventors Collins et al., filed on Jul. 27, 2021.
U.S. Appl. No. 17/436,944, inventors Blakeney et al., filed on Sep. 7, 2021.
Anonymous, "Lam Research enables next-generation memory with industry's first ALD process for low-fluorine tungsten fill" Semiconductor Digest News and Industry Trends for Solid State Technology, Aug. 2016, 2 Pages.
Chiu, H. et al., "Deposition of Molybdenum Carbonitride Thin Films from Mo(NBu$^t$)$_2$(NHBu$^t$)$_2$", J. Mater. Res, Jul. 1994, vol. 9, No. 7, pp. 1622-1624.
Co-pending U.S. pending U.S. Appl. No. 17/763,529, filed Mar. 24, 2022.
Coventor Brochure "3D NAND: Challenges Beyond 96-Layer Memory Arrays", Oct. 12, 2018, pp. 1-4.
Dominique, S. et al., "An alternative to Tungsten in 3D-NAND technology", IEEE International Interconnect Technology Conference (IITC), 2021, pp. 1-3.
International Preliminary Report on Patentability dated Mar. 10, 2022, in Application No. PCT/US2020/070434.
International Preliminary Report on Patentability dated Mar. 3, 2022, in Application No. PCT/US2020/070390.
International Search Report and Written Opinion dated Feb. 3, 2021, in Application No. PCT/US2020/055596.
International Search Report and Written Opinion dated Jun. 9, 2022 in International Application No. PCT/US2022/017005.
International Search Report and Written Opinion dated Sep. 7, 2022 in Application No. PCT/US2022/028845.
International Preliminary Report on Patentability dated Apr. 28, 2022, in PCT Application No. PCT/US2020/055596.
International Preliminary Report on Patentability dated Mar. 17, 2022 in PCT Application No. PCT/US2020/048951.
International Search Report and Written Opinion dated Feb. 4, 2021, in PCT Application No. PCT/US2020/070390.
JP Office Action dated Apr. 19, 2022 in Application No. JP20200504286 with English translation.
Kim, K. et al., "Simulation of Residual Stress and Its Impact on a Poly-Silicon Channel for Three-Dimensional, Stacked, Vertical-NAND Flash Memories", Journal of the Korean Physical Society, 2017, vol. 70 (12), pp. 1041-1048.
KR Office Action dated Sep. 27, 2022, in Application No. KR10-2017-0102113.
KR Office Action dated Feb. 21, 2022, in Application No. KR10-2017-0102113 with English Translation.
KR Office Action dated May 30, 2022, in Application No. KR10-2019-7033130 With English Translation.
Lee, B. et al., "ALD Tungsten Solves Capacity Challenges in 3D NAND Device Manufacturing", Lam Brochure, Jan. 2019, pp. 1-4.
Lin, S. et al., "Effect of Nitrogen on the Physical Properties and work Function of MoN$_x$ Cap Layers on HfO$_2$ Gate Dielectrics", ECS Journal of Solid State Science and Technology, 2014, vol. 3, No. 12, pp. N161-N165.
Mccain, M.N. et al., "Aerosol-Assisted Chemical Vapor Deposition of Lubricating MoS$_2$ Films. Ferrous Substrates and Titanium Film Doping", Chemistry of Materials, 2008, vol. 20, No. 16, pp. 5438-5443.
Miikkulainen, V. et al., "Atomic Layer Deposition of Molybdenum Nitride from Bis(tert-butylimido)-bis(dimethylamido)molybdenum and Ammonia onto Several Types of Substrate Materials with Equal Growth per Cycle", Chemistry of Materials, 2007, vol. 19, pp. 263-269.
Miikkulainen, V. et al., "Bis(tert-butylimido)-bis(dialkylamido) Complexes of Molybdenum as Atomic Layer Deposition (ALD) Precursors for Molybdenum Nitride: the Effect of the Alkyl Group", Chemical Vapor Deposition, 2008, vol. 14, pp. 71-77.
Mohimi, E, et al., "Low temperature chemical vapor deposition of superconducting molybdenum carbonitride thin films", Journal of Vacuum Science & Technology A , 2019, vol. 37, No. 2, 021503, 6 pages.
Nandi, D.K. et al., "Atomic Layer Deposited Molybdenum Nitride Thin Film: a Promising Anode Material for Li Ion Batteries", ACS Applied Material Interfaces, 2014, vol. 6, pp. 6606-6615.
Ranade, P. et al., "Work Function Engineering of Molybdenum Gate Electrodes by Nitrogen Implantation", Electrochemical and Solid-State Letters, 2001, vol. 4, No. 11, pp. G85-G87.
Shimizu, H. et al., "Precursor-based designs of nano-structures and their processing for Co(W) alloy films as a single layered barrier/liner layer in future Cu-interconnect", Journal of Materials Chemistry C, 2015, vol. 3, pp. 2500-2510.
TW Office Action dated Aug. 16, 2022, in Application No. TW107141042 with English translation.
TW Office Action dated May 24, 2022, in Application No. TW20180112210 with English translation.
TW Office Action dated Sep. 14, 2022, in Application No. TW107112210 with English translation.
U.S. Advisory Action dated May 3, 2022 in U.S. Appl. No. 16/764,812.
U.S. Corrected Notice of Allowance dated May 11, 2022, in U.S. Appl. No. 16/724,231.
U.S. Final office Action dated Jul. 25, 2022 in U.S. Appl. No. 17/250,452.
U.S. Non Final Office Action dated Mar. 21, 2022, in U.S. Appl. No. 17/250,452.
U.S. Non-Final Office Action dated May 16, 2022 in U.S. Appl. No. 16/764,812.
U.S. Non-Final Office Action dated Jun. 24, 2022, in U.S. Appl. No. 17/436,944.
U.S. Notice of Allowance dated Jun. 7, 2022 in U.S. Appl. No. 17/250,014.
U.S. Notice of Allowance dated Sep. 16, 2022 in U.S. Appl. No. 17/250,014.
U.S. Appl. No. 17/814,206, inventors Collins et al., filed on Jul. 21, 2022.
U.S. Appl. No. 17/814,207, inventors Thombare et al., filed on Jul. 21, 2022.
U.S. Appl. No. 17/814,209, inventors Cleemput et al., filed on Jul. 21, 2022.
U.S. Advisory Action dated Oct. 18, 2022, in U.S. Appl. No. 17/250,452.

(56) References Cited

OTHER PUBLICATIONS

Barry, S.T., "Amidinates, Guanidinates and Iminopyrrolidinates: Understanding Precursor Thermolysis to Design a Better Ligand," Coordination Chemistry Reviews, Dec. 2013, vol. 257(23-24), pp. 3192-3201.
Barry, S.T., et al., "The Chemistry of Inorganic Precursors during the Chemical Deposition of Films on Solid Surfaces," Accounts of chemical research, 2018, vol. 51, pp. 800-809.
Becker, J., et al., "Diffusion Barrier Properties of Tungsten Nitride Films Grown by Atomic Layer Deposition From bis(tert-butylimido) bis(dimethylamido)tungsten and ammonia," Applied Physics Letters, 2003, vol. 82 (14), pp. 2239-2241.
CN Office Action dated Dec. 28, 2023 in CN Application No. 202080059499.7 with EnglishTranslation.
CN Office Action dated Feb. 28, 2023 in Application No. 201880038116.0 with English translation.
CN Office Action dated Jan. 13, 2023 in CN Application No. CN201980049916.7 with English Translation.
CN Office Action dated Jan. 16, 2023 in Application No. CN202080020646.X with English translation.
CN Office Action dated Jan. 18, 2024 in CN Application No. 202080020646.X with English translation.
CN Office Action dated Jul. 9, 2024 in CN Application No. 201980049916.7 with English translation.
CN Office Action dated Jun. 7, 2024 in CN Application No. 201880074995.2, with English Translation.
CN Office Action dated Jun. 27, 2024 in CN Application No. 201980076277.3 with English translation.
CN Office Action dated May 31, 2024 in CN Application No. 201980038600.8 with English translation.
CN Office Action dated Nov. 17, 2022, in Application No. CN202080011300.3 with English translation.
CN Office Action dated Sep. 24, 2023, in Application No. CN202080020646.X with English translation.
CN Office Action dated Sep. 28, 2023, in application No. CN201980049916.7 with English translation.
Colaianni, M.L., et al., "The Adsorption and Dissociation of Carbon Monoxide on Clean and Oxygen-Modified Mo(110) Surfaces," Journal of the American Chemical Society, 1992, vol. 114(10), pp. 3735-3743.
Cotton, F.A., "Strong Homonuclear Metal-Metal Bonds," Accounts of Chemical Research, 1969, vol. 2 (8), pp. 240-247.
Dezelah IV, C.L., et al., "A Low Valent Metalorganic Precursor for the Growth of Tungsten Nitride Thin Films by Atomic Layer Deposition," Journal of Materials Chemistry, 2007, vol. 17, pp. 1109-1116.
Dezelah IV, C.L., et al., "Atomic Layer Deposition of Tungsten(III) Oxide Thin Films from $W_2(NMe_2)_6$ and Water: Precursor-Based Control of Oxidation State in the Thin Film Material," Journal of the American Chemical Society, Aug. 2, 2006, vol. 128(30), pp. 9638-9639.
EP Extended European Search report dated Dec. 14, 2023, in Application No. EP20854552.5.
EP Partial Supplementary European Search report dated Sep. 13, 2023, in Application No. EP20854552.5.
Gall D., "Electron Mean Free Path in Elemental Metals," Journal of Applied Physics, Feb. 23, 2016, vol. 119, 6 Pages.
International Preliminary Report on Patentability dated Dec. 1, 2022, in PCT Application No. PCT/US2021/033564.
International Search Report and Written Opinion dated Sep. 9, 2021 in Application No. PCT/US2021/033564.
International Preliminary Report on Patentability and Written Opinion dated Jun. 27, 2024 in PCT Application No. PCT/US2022/080705.
International Preliminary Report on Patentability and Written Opinion dated Jun. 27, 2024 in PCT Application No. PCT/US2022/080863.
International Preliminary Report on Patentability and Written Opinion dated Nov. 23, 2023 in PCT Application No. PCT/US2022/028845.
International Preliminary Report on Patentability and Written Opinion dated Sep. 6, 2024 in PCT Application No. PCT/US2023/062877.
International Preliminary Report on Patentability dated Jul. 20, 2023, in PCT Application No. PCT/US2022/011053.
International Preliminary Report on Patentability dated Jun. 1, 2023, in Application No. PCT/US2021/058099.
International Preliminary Report on Patentability dated Oct. 26, 2023, in PCT Application No. PCT/US2022/024295.
International Preliminary Report on Patentability dated Sep. 7, 2023, in PCT Application No. PCT/US2022/017005.
International Search Report and Written Opinion dated Apr. 7, 2023 in PCT Application No. PCT/US2022/080705.
International Search Report and Written Opinion dated Apr. 25, 2022, for International Application No. PCT/US2022/011053.
International Search Report and Written Opinion dated Apr. 27, 2023 in PCT Application No. PCT/US2022/080863.
International Search Report and Written Opinion dated Aug. 2, 2022 in Application No. PCT/US2022/024295.
International Search Report and Written Opinion dated Aug. 11, 2023, in Application No. PCT/US2023/019795.
International Search Report and Written Opinion dated Aug. 16, 2023, in Application No. PCT/US2023/017635.
International Search Report and Written Opinion dated Aug. 16, 2023, in Application No. PCT/US2023/019800.
International Search Report and Written Opinion dated Aug. 16, 2023, in ApplicationNO.PCT/US2023/019000.
International Search Report and Written Opinion dated Feb. 7, 2024 in PCT Application No. PCT/US2023/034858.
International Search Report and Written Opinion dated Feb. 16, 2024 in PCT Application No. PCT/US2023/035873.
International Search Report and Written Opinion dated Jul. 23, 2024 in PCT Application No. PCT/US2024/023361.
International Search Report and Written Opinion dated Jun. 19, 2023, in Application No. PCT/US2023/062877.
International Search Report and Written Opinion dated Mar. 3, 2022, in Application No. PCT/US2021/058099.
International Search Report and Written Opinion dated Oct. 17, 20223 in PCT Application No. PCT/US2023/069018.
International Search Report and Written Opinion dated Sep. 6, 2023, in Application No. PCT/US2023/023023.
Ishihara, S., et al., "MOCVD of Monolayer $MoS_2$ using Novel Molybdenum Precursor i-Pr2DADMo(CO)3," Materials Research Society, 2018, vol. 3, pp. 379-384.
Jang, Y., et al., "Highly-conformal Nanocrystalline Molybdenum Nitride Thin Films by Atomic Layer Deposition as a Diffusion Barrier Against Cu," Journal of Alloys and Compounds, 2016, vol. 663, pp. 651-658.
JP Office Action dated Aug. 6, 2024 in JP Application No. 2023-547183, with English Translation.
JP Office Action dated Aug. 20, 2024 in JP Application No. 2022-514153, with English Translation.
JP Office Action dated Dec. 12, 2023 in JP Application No. 2021-527153 with English Translation.
JP Office Action dated Dec. 26, 2023, in application No. JP20220141888 with English translation.
JP Office Action dated Feb. 6, 2024 in JP Application No. 2021-543355 with English translation.
JP Office Action dated Feb. 20, 2024 in JP Application No. 2023-547183 with English translation.
JP Office Action dated Feb. 27, 2024 in Application No. JP2022-522581 with English Translation.
JP Office Action dated Jul. 16, 2024 in JP Application No. 2021-527153, with English Translation.
JP Office Action dated Jun. 6, 2023 in Application No. JP2020561743 With English translation.
JP Office Action dated Jun. 11, 2024 in JP Application No. 2023-95239, with English Translation.
JP Office Action dated Mar. 5, 2024 in JP Application No. 2022-141887, with English Translation.
JP Office Action dated Mar. 19, 2024 in JP Application No. 2020-561743, with English Translation.

(56) References Cited

OTHER PUBLICATIONS

JP Office Action dated Mar. 26, 2024 in JP Application No. 2022-524041 with English translation.
JP Office Action dated Oct. 3, 2023 in Application No. JP2022-522581 with English Translation.
JP Office Action dated Oct. 3, 2023 in Application No. JP2023-95239 with English Translation.
JP Office Action dated Sep. 3, 2024 in JP Application No. 2022-141888 with English translation.
JP Office Action dated Sep. 3, 2024 in JP Application No. 2022-509591, with English Translation.
JP Office Action dated Sep. 5, 2023, in Application No. JP2022-145721 with English translation.
Juppo, et al., "Deposition of Molybdenum Thin Films by an Alternate Supply of MoCl 5 and Zn," Journal of Vacuum Science and Technology A, vol. 16, Sep./Oct. 1998, doi: 10.1116/1.581430, pp. 2845-2850.
Karunarathne, M.C., et al., "Synthesis, Structural Characterization, and Volatility Evaluation of Zirconium and Hafnium Amidate Complexes," Journal of Organometallic Chemistry, 2017, vol. 847, pp. 204-212.
Kerrigan, M.M., et al., "Low Temperature, Selective Atomic Layer Deposition of Cobalt Metal Films Using Bis(1,4-di-tert-butyl-1,3-diazadienyl)cobalt and Alkylamine Precursors," Chemistry of Materials, 2017, vol. 29(17), pp. 7458-7466.
Kerrigan, M.M., et al., "Low Temperature, Selective Atomic Layer Deposition of Nickel Metal Thin Films," ACS Applied Materials & Interfaces, 2018, vol. 10(16), pp. 14200-14208.
Kim, T., et al., "Thermal Chemistry of Cu(I)-Iminopyrrolidinate and Cu(I)-Guanidinate Atomic Layer Deposition (ALD) Precursors on Ni(110) Single-Crystal Surfaces," Chemistry of Materials, 2013, vol. 25, pp. 3630-3639.
Knisley, T.J., et al., "Volatility and High Thermal Stability in Mid to Late First Row Transition Metal Diazadienyl Complexes," Organometallics, 2011, vol. 30(18), pp. 5010-5017.
KR Notice of Allowances dated Aug. 28, 2024 in KR Application No. 10-2023-7028915 with English Translation.
KR Office Action dated Dec. 15, 2023 in KR Application No. 10-2023-7028915, with English Translation.
KR Office Action dated Jan. 27, 2023 in Application No. KR10-2017-0102113 with English Translation.
KR Office Action dated Jul. 28, 2023, in Application No. KR10-2023-0081299 with English Translation.
KR Office Action dated Jun. 27, 2024 in KR Application No. 10-2023-0081299, with English Translation.
KR Office Action dated Mar. 1, 2024 in KR Application No. 10-2021-7018803, with English Translation.
KR Office Action dated Mar. 29, 2024 in KR Application No. 10-2020-7017697 with English translation.
KR Office Action dated May 7, 2024 in KR Application No. 10-2020-7034800, with English Translation.
KR Office Action dated Nov. 14, 2023, in KR Application No. 10-2022-7031314 with English Translation.
KR Office Action dated Oct. 27, 2022 in Application No. KR10-2022-7026373 with English translation.
KR Office Action dated Sep. 27, 2022, in Application No. KR10-2017-0102113 with English translation.
Makela, M., et al., "Thermal Atomic Layer Deposition of Continuous and Highly Conducting Gold Thin Films," Chemistry of Materials, 2017, vol. 29, pp. 6130-6136.
Muhtade, M., et al., "Time Influence on Thickness and Grains for Molybdenum Thin Film," 2017, e-ISSN: 2289-8131, vol. 9, No. 2-13.
Ouyang, T., et al., "A Surface Chemistry Route to Molybdenum Sulfide and Germanide Films Using the Single-Source Precursor Tetrakis(diethylaminodithiocarbomato)molybdate(IV)," The Journal of Physical Chemistry B, 2004, vol. 108(5), pp. 17537-17545.
Pol, V. G., et al., "Fabrication of Magnetic Nanoparticles Using Rapet Technique With or Without Employing External Magnetic Field," The Journal of Physical Chemistry C, 2008, vol. 112, pp. 6627-6637.
Qu Jingxin, et al., "Surface Engineering Handbook," Chemical Industry Publishing House, Mar. 31, 1998, p. 277.
Seghete, D et al., Molybdenum Atomic Layer Deposition Using MoF6 and Si2H6 As the Reactants, Chemistry of Materials, 2011, vol. 23 No. 7, pp. 1668-1678.
SG Office Action dated Oct. 11, 2023, in application No. SG11202201453T.
SG Office Action dated Sep. 19, 2023, in application No. SG11202202087P.
SG Search Report and Written Opinion dated Aug. 22, 2024 in SG Application No. 11202203845Q.
SG Search Report and Written Opinion dated Feb. 10, 2023 in Application No. SG11202109796Q.
SG Written Opinion dated Oct. 4, 2023 in Application No. SG11202109796Q.
Shirazi, M., et al., "Initial Stage of Atomic Layer Deposition of 2D-MoS$_2$ on a SiO$_2$ surface: a DFT study," Physical Chemistry Chemical Physics, 2018, vol. 20 (24), pp. 1-18.
Singapore Written Opinion dated Mar. 15, 2023 issued in Application No. SG11202108217U.
Stephenson T A., et al., "487. Molybdenum(II) Carboxylates," Journal of the Chemical Society, 1964, pp. 2538-2541.
Sun Yicai, et al., "Design Manufacturing and Application," Metallurgical Industry Publishing House, Apr. 30, 2000, p. 166.
TW Office Action dated Apr. 24, 2024 in TW Application No. 109130013, With English Translation.
TW Office Action dated Aug. 31, 2023, in Application No. TW109102778 with English translation.
TW Office Action dated Dec. 5, 2023 in TW Application No. 109107661 with English translation.
TW Office Action dated Dec. 21, 2023 in Application No. TW108126326 with English translation.
TW Office Action dated Feb. 10, 2023 in Application No. TW107112210 with English translation.
TW Office Action dated May 9, 2024 in TW Application No. 109107661 with English translation.
TW Office Action dated May 22, 2024 in TW Application No. 109135654, with English Translation.
TW Office Action dated Oct. 19, 2023 in Application No. TW107112210 with English translation.
U.S. Final Office Action dated Feb. 2, 2023 in U.S. Appl. No. 17/436,944.
U.S. Final Office Action dated Apr. 12, 2024 in U.S. Appl. No. 17/814,206.
U.S. Final Office Action dated Feb. 12, 2024 in U.S. Appl. No. 17/589,416.
U.S. Final office Action dated Jun. 26, 2023 in U.S. Appl. No. 17/589,416.
U.S. Final Office Action dated Mar. 1, 2023 in U.S. Appl. No. 17/250,452.
U.S. Final Office Action dated May 8, 2024 in U.S. Appl. No. 17/250,452.
U.S. Final Office Action dated May 9, 2024 in U.S. Appl. No. 17/814,207.
U.S. Final Office Action dated May 31, 2023, in U.S. Appl. No. 17/814,207.
U.S. Final Office Action dated Nov. 30, 2022 in U.S. Appl. No. 16/764,812.
U.S. Final office Action dated Sep. 14, 2023 in U.S. Appl. No. 17/662,220.
U.S. Non-Final Office Action dated Aug. 7, 2024 in U.S. Appl. No. 18/310,523.
U.S. Non-Final Office Action dated Aug. 29, 2023, in U.S. Appl. No. 17/310,293.
U.S. Non-Final Office Action dated Feb. 2, 2023 in U.S. Appl. No. 17/589,416.
U.S. Non-Final Office Action dated Feb. 2, 2023 in U.S. Appl. No. 17/662,220.

(56) References Cited

OTHER PUBLICATIONS

U.S. Non-Final Office Action dated Feb. 29, 2024 in U.S. Appl. No. 17/294,378.
U.S. Non-Final Office Action dated Jan. 17, 2024 in U.S. Appl. No. 17/814,207.
U.S. Non-Final Office Action dated Jul. 20, 2023, in U.S. Appl. No. 17/814,209.
U.S. Non-Final Office Action dated Jul. 24, 2024 in U.S. Appl. No. 17/763,529.
U.S. Non-Final Office Action dated Jun. 20, 2023, in U.S. Appl. No. 17/250,452.
U.S. Non-Final Office Action dated Jun. 21, 2024 in U.S. Appl. No. 18/379,397.
U.S. Non-Final Office Action dated May 23, 2024 in U.S. Appl. No. 17/662,220.
U.S. Non-Final Office Action dated Nov. 6, 2023, in U.S. Appl. No. 17/814,206.
U.S. Non-Final Office Action dated Nov. 30, 2022 in U.S. Appl. No. 17/814,207.
U.S. Non-Final Office Action dated Nov. 30, 2023 in U.S. Appl. No. 17/250,452.
U.S. Non-Final Office Action dated Oct. 26, 2023, in U.S. Appl. No. 17/589,416.
U.S. Non-Final Office Action dated Sep. 5, 2024 in U.S. Appl. No. 17/814,206.
U.S. Notice of Allowance dated Apr. 4, 2024 in U.S. Appl. No. 17/310,293.
U.S. Notice of Allowance dated Aug. 3, 2023, in U.S. Appl. No. 17/436,944.
U.S. Notice of Allowance dated Jan. 2, 2024 in U.S. Appl. No. 17/310,293.
U.S. Notice of Allowance dated Jul. 3, 2024 in U.S. Appl. No. 17/294,378.
U.S. Notice of Allowance dated Jul. 14, 2023 in U.S. Appl. No. 17/436,944.
U.S. Notice of Allowance dated Mar. 27, 2024 in U.S. Appl. No. 17/814,209.
U.S. Notice of Allowance dated Nov. 14, 2023 in U.S. Appl. No. 17/814,209.
U.S. Notice of Allowance dated Oct. 4, 2023, in U.S. Appl. No. 17/436,944.
U.S. Appl. No. 18/253,038, inventors Lai C.S, et al., filed on May 16, 2023.
U.S. Appl. No. 18/286,994, inventors Thombare S V, et al., filed on Oct. 13, 2023.
U.S. Appl. No. 18/559,783, inventor Bhadauriya S, filed on Nov. 23, 2023.
U.S. Appl. No. 18/714,506, inventors Mandia D.J., et al., filed on May 29, 2024.
U.S. Appl. No. 18/716,846, inventors Mandia D.J, et al., filed on Jun. 5, 2024.
U.S. Appl. No. 18/799,905, inventors Thombare S.V, et al., filed on Aug. 9, 2024.
U.S. Appl. No. 18/837,560, inventors Hsieh Y, et al., filed on Aug. 9, 2024.
U.S. Appl. No. 62/362,582, inventors Meng et al., filed on Jul. 14, 2016.
U.S. Restriction requirement dated May 13, 2024, in U.S. Appl. No. 18/310,523.
U.S. Supplemental Notice of Allowance dated Dec. 14, 2022 in U.S. Appl. No. 17/250,014.
Werndrup P., et al., A Single-source-precursor Approach to Late Transition Metal Molybdate Materials: the Structural Role of Chelating Ligands in the Formation of Heterometallic Heteroleptic Alkoxide Complexes, European Journal of Inorganic Chemistry, 2006, vol. 2006 (7), 1413-1422.
Zhao, Y., et al., "Synthesis and Structures of Mono-and Dinuclear Molybdenum Complexes with Reduced α-Diimine Ligands," European Journal of Inorganic Chemistry, 2016, pp. 5411-5417.
CN Office Action dated Nov. 29, 2024 in CN Application No. 201880074995.2, with English Translation.
International Preliminary Report on Patentability and Written Opinion dated Jan. 2, 2025 in PCT Application No. PCT/US2023/069018.
International Preliminary Report on Patentability and Written Opinion dated Nov. 14, 2024 in PCT Application No. PCT/US2023/019795.
International Preliminary Reporton Patentability and Written Opinion dated Dec. 5, 2024 in PCT Application No. PCT/US2023/023023.
JP Office Action dated Jan. 7, 2025 in JP Application No. 2021-527153 with English translation.
KR Notice of Allowance dated Nov. 25, 2024 in KR Application No. 10-2023-0081299, with English Translation.
KR Notice of Allowances dated Jan. 8, 2025 in KR Application No. 10-2022-7031314 with English Translation.
KR Office Action dated Dec. 3, 2024 in KR Application No. 10-2021-7032632 with English Translation.
KR Office Action dated Dec. 20, 2024 in KR Application No. 10-2022-7015736, with English Translation.
KR Office Action dated Nov. 21, 2024 in KR Application No. 10-2021-7005949 with English Translation.
U.S. Final Office Action dated Jan. 3, 2025 in U.S. Appl. No. 17/662,220.
U.S. Appl. No. 18/866,057, inventors Wongsenakhum P, et al., filed on Nov. 14, 2024.
U.S. Appl. No. 18/877,501, inventors Fox A.R et al., filed on Dec. 20, 2024.
CN Office Action dated Oct. 17, 2024 in CN Application No. 202080059499.7 with English translation.
International Preliminary Report on Patentability and Written Opinion dated Nov. 7, 2024 in PCT Application No. PCT/US2023/019800.
International Preliminary Report on Patentability and Written Opinion dated Oct. 17, 2024 in PCT Application No. PCT/US2023/017635.
International Preliminary Report on Patentability and Written Opinion dated Oct. 31, 2024 in PCT Application No. PCT/US2023/019000.
International Search Report and Written Opinion dated Oct. 22, 2024 in PCT Application No. PCT/US2024/037234.
JP Notice of Allowances dated Oct. 1, 2024 in JP Application No. 2021-543355 with English translation.
JP Notice of Allowances dated Oct. 15, 2024 in JP Application No. 2021-552861 with English translation.
JP Office Action dated Nov. 12, 2024 in JP Application No. 2022-522581 with English translation.
JP Office Action dated Oct. 29, 2024 in JP Application No. 2022-141887 with English translation.
KR Office Action dated Oct. 28, 2024 in KR Application No. 10-2021-7018803 with English Translation.
KR Office Action dated Sep. 26, 2024 in KR Application No. 10-2022-7031314, with English Translation.
U.S. Final Office Action dated Oct. 10, 2024 in U.S. Appl. No. 18/379,397.
U.S. Appl. No. 18/857,125, inventors Griffiths M.B, et al., filed on Oct. 15, 2024.
U.S. Appl. No. 18/859,971, inventors Mahenderkar N.K, et al., filed on Oct. 24, 2024.
U.S. Appl. No. 18/907,394, inventors Van Cleemput P.A, et al., filed on Oct. 4, 2024.

* cited by examiner

MOLYBDENUM DEPOSITION

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Deposition of metals is an integral part of many semiconductor fabrication processes. These materials may be used for horizontal interconnects, vias between adjacent metal layers, and contacts between metal layers and devices. However, as devices shrink and more complex patterning schemes are utilized in the industry, uniform deposition of low resistivity metal films becomes a challenge.

SUMMARY

Provided are methods of filling patterned features with molybdenum (Mo), The methods involve selective deposition of Mo films on bottom metal-containing surfaces of a feature including dielectric sidewalls. The selective growth of Mo on the bottom surface allows bottom-up growth and high quality, void-free fill. Also provided are related apparatus.

One aspect of the disclosure relates to a method that includes providing a substrate including a feature having a feature bottom and feature sidewalls, where the feature bottom includes a metal-containing surface and the feature sidewalls include oxide or nitride surfaces and performing multiple cycles of an atomic layer deposition (ALD) process to selectively deposit a molybdenum (Mo) film on the metal-containing surface relative to the oxide or nitride surfaces, where the ALD process includes exposing the feature to alternate pulses of molybdenum-containing oxyhalide precursor and a reducing agent at a first substrate temperature.

In some embodiments, the method also includes, prior to performing the multiple cycles of the ALD deposition process, exposing the metal-containing surface to a hydrogen-containing plasma. In some embodiments, the reducing agent is thermal hydrogen ($H_2$). In some embodiments, the reducing agent is provided in a plasma generated from hydrogen ($H_2$). In some embodiments, the partial pressure of the reducing agent is at least 10 torr. In some embodiments, the molybdenum-containing precursor is a molybdenum oxychloride. In some embodiments, the first temperature is no more than 600° C. In some embodiments, the first temperature is no more than 450° C. In some embodiments, the first temperature is no more than 400° C. In some embodiments, the molybdenum-containing precursor is a molybdenum oxyfluoride. In some embodiments, the method further includes partially filling the feature while the substrate is at the first temperature, and completely filling the feature (or filling a second portion of the feature) while the substrate is at a second temperature, the second temperature being greater than the first temperature. In some such embodiments, partially filling the feature takes place in a first station of a process chamber, and the completely filling the feature (or filling a second portion of the feature) takes place at a second station of the process chamber. In some embodiments, the metal-containing surface is one of a material from a group including cobalt, ruthenium, copper, tungsten, molybdenum, titanium, tin, tantalum, nickel, iridium, and rhodium. In some embodiments, the metal-containing surface is one of a material from a group including titanium nitride, molybdenum nitride, tungsten nitride, tungsten carbon nitride, titanium aluminum carbide, titanium silicide, and tantalum nitride. In some embodiments, the metal-containing surface is an elemental metal surface. In some embodiments, the sidewalls include an oxide. Examples of oxides include polyethyleneoxide, tetraethyl orthosilicate, flowable oxide, and a carbon doped oxide. In some embodiments, the Mo film on the metal-containing film has a larger thickness than the Mo film on the oxide or nitride surfaces of the sidewalls, such as at least about 20 Å greater than the Mo film on the oxide or nitride surfaces.

Another aspect of the disclosure relates to a method that includes: providing a substrate including a feature having a feature bottom and feature sidewalls, where the feature bottom includes a metal-containing surface and the feature sidewalls include oxide or nitride surfaces; and performing a deposition process to selectively deposit a molybdenum (Mo) film on the metal-containing surface relative to the oxide or nitride surfaces, where the deposition process includes exposing the feature to a molybdenum-containing oxyhalide precursor and a reducing agent at a first substrate temperature.

In some embodiments, the method also includes, prior to performing the deposition process, exposing the metal-containing surface to a hydrogen-containing plasma. In some embodiments, the metal-containing surface may be exposed to other treatments with examples including halogen-containing plasmas such as chlorine-(Cl–) based plasmas. In some embodiments, the reducing agent is thermal hydrogen (1-12). In some embodiments, the reducing agent is provided in a plasma generated from hydrogen ($H_2$). In some embodiments, the partial pressure of the reducing agent is at least 10 torr. In some embodiments; the molybdenum-containing precursor is a molybdenum oxychloride. In some embodiments, the first temperature is no more than 600° C. In some embodiments, the first temperature is no more than 450° C. In some embodiments, the first temperature is no more than 400° C. In some embodiments, the molybdenum-containing precursor is a molybdenum oxyfluoride. In some embodiments, the method further includes partially filling the feature while the substrate is at the first temperature, and completely filling the feature (or filling a second portion of the feature) while the substrate is at a second temperature, the second temperature being greater than the first temperature. In some such embodiments, partially filling the feature takes place in a first station of a process chamber, and the completely filling the feature (or filling a second portion of the feature) takes place at a second station of the process chamber. In some embodiments, the metal-containing surface is one of a material from a group including cobalt, ruthenium, copper, tungsten, molybdenum, titanium, tin, tantalum, nickel, iridium, and rhodium. In some embodiments, the metal-containing surface is one of a material from a group including titanium nitride, molybdenum nitride, tungsten nitride, tungsten carbon nitride, titanium aluminum carbide, titanium silicide, and tantalum nitride. In some embodiments, the metal-containing surface is an elemental metal surface. In some embodiments, the sidewalls include an oxide. Examples of oxides include polyethyleneoxide, tetraethyl orthosilicate, flowable oxide, and a carbon doped oxide. In some embodiments, the Mo film on the metal-containing film has a larger thickness than the Mo film on the oxide or nitride surfaces of the sidewalls.

These and further aspects are described below with reference to the drawings.

DETAILED DESCRIPTION

Provided are methods of filling patterned features with molybdenum (Mo). The methods involve selective deposition of Mo films on bottom metal-containing surfaces of a feature including dielectric sidewalls. The selective growth of Mo on the bottom surface allows bottom-up growth and high quality, void-free fill.

Figure 1:
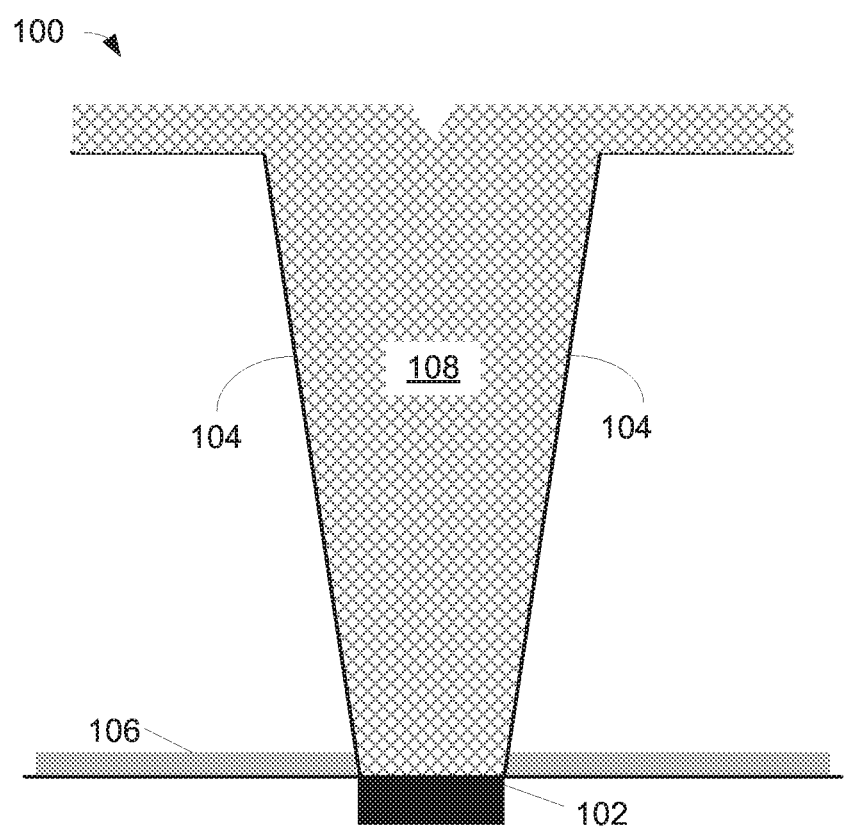
FIG. 1 shows an example of a molybdenum (Mo) interconnect according to various embodiments.

FIG. 1 depicts an example of a feature 100 according to various embodiments. The feature 100 includes a bottom surface 102 and one or more sidewall surfaces 104. An etch stop layer (ESL) 106 is also shown. The bottom surface 102 may be a metal-containing surface. The structure 100 is filled with molybdenum to form a Mo interconnect 108 that provides an electrical connection to the underlying contact.

In some embodiments, the bottom surface 102 is a metal-containing surface. The metal-containing surface may contain any appropriate metal, such as cobalt (Co), ruthenium (Ru), copper (Cu), tungsten (W), molybdenum (Mo), nickel (Ni), iridium (Ir), rhodium (Rh), tantalum (Ta), and titanium (Ti). In some embodiments, the metal-containing surface 102 is an elemental metal surface. There may be some oxide formed on the metal-containing surface due to exposure to moisture. In some embodiments, the metal-containing surface is a metal compound with examples including a titanium nitride (TiN), molybdenum nitride (MoN$_x$), tungsten nitride (WN), tungsten carbon nitride (WC$_x$N$_y$), a titanium aluminum carbide (TiAl$_x$C$_y$), titanium silicide (TiSi$_2$), or tantalum nitride (TaN) surface. These surfaces may exhibit selectivity with respect to dielectric oxides.

As used herein, oxide surfaces include alkoxides such as tetraethyl orthosilicate (TEOS), fluorosilicate glass (FSG), flowable oxides, spin-on-glasses, carbon doped oxides, etc. In some embodiments, the oxide surface is a silicon-based oxide with examples given above.

The one or more sidewall surfaces 104 are dielectric surfaces. Such surfaces include alkoxides such as poly(2-ethyl-2-oxazoline) (PEOX) and silicon-based oxides including tetraethyl orthosilicate (TEOS) oxide, flowable silicon-based oxides, carbon doped silicon-based oxides, etc. These surfaces may be part of the main dielectric layer surrounding the feature. Selectivity refers to the preference in deposition on a metal surface, such as Co, W or Cu surface relative to a dielectric surface. It may be quantified as a ratio of deposition rates or as a ratio of deposition thicknesses after a certain number of deposition cycles.

In some embodiments, the sidewall surfaces may be nitrides e.g., Si$_x$N$_y$) rather than oxides. The nitrides may be silicon-based nitrides or silicon-based oxynitrides. Selectivity of Mo film deposition on elemental metal with respect to nitrides is similar to that with respect to oxides.

The Mo interconnect 108 may be part of any appropriate part of a partially fabricated semiconductor device, including a source/drain (S/D) connection, a middle of the line (MOL) structure or an back end of line (BEOL) structure.

Figure 2:
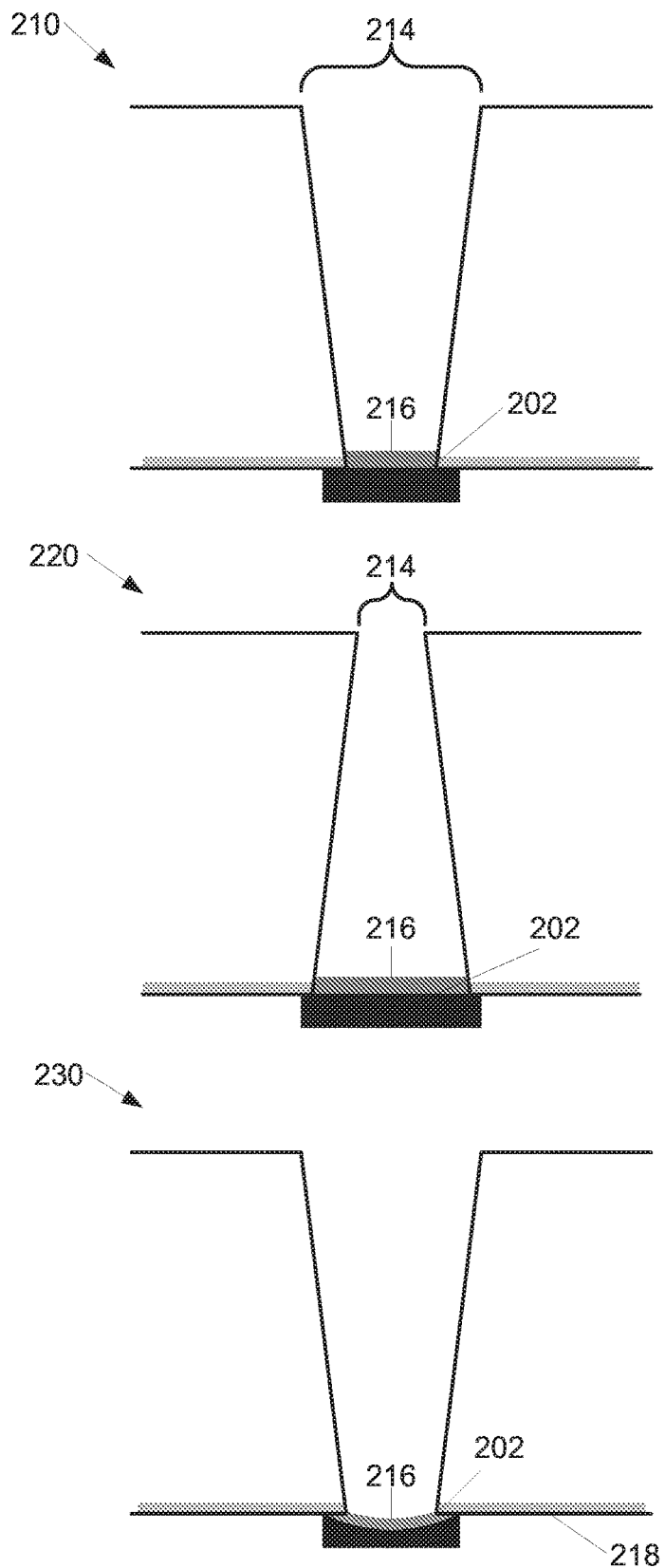
FIG. 2 shows examples of patterned features into which selective deposition of a Mo film may be performed according to various embodiments.

FIG. 2 shows example embodiments of patterned features in which selective deposition of a Mo film may be performed. A patterned feature maybe a via or a trench or other appropriate feature formed as a result of a patterning operation in a dielectric layer. Feature 210 shows an example of a patterned feature having an open profile that expands gradually from the bottom of the feature to the feature opening 214.

Feature 220 shows an example of a patterned feature having a re-entrant profile that narrows from the bottom of the feature to the feature opening 214. A re-entrant profile may also include an overhang at the feature opening 214. Feature 230 shows a feature with a metal undercut profile. According to various implementations, the profile has the metal-containing surface below the sidewall base 218 of the feature 230. There may be voids between the bottom surface 202 and the sidewall base 218. In each of the above profiles, the bottom surface 202 may be a metal containing-surface. There may be metal-oxide 216 formed on bottom surface 202.

Figure 3:
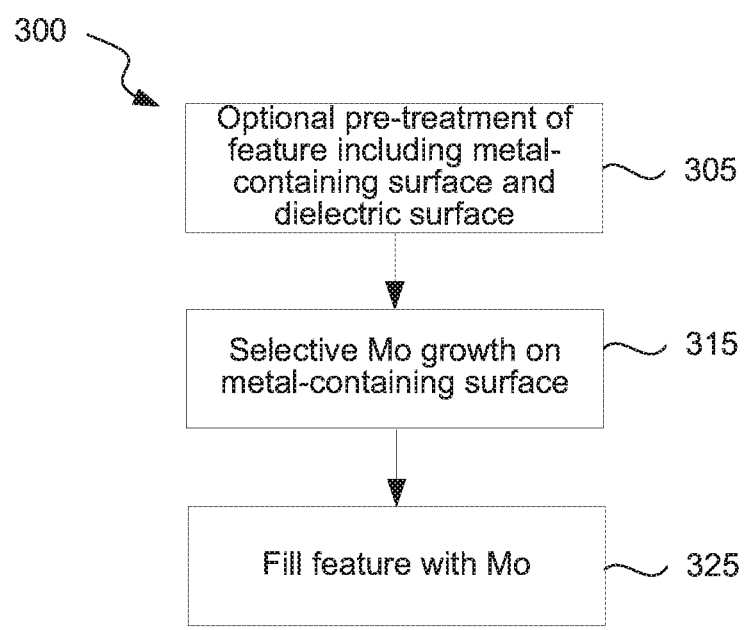
FIG. 3 shows an example of a selective deposition method to fill a feature with molybdenum according to various embodiments.
Figure 4:
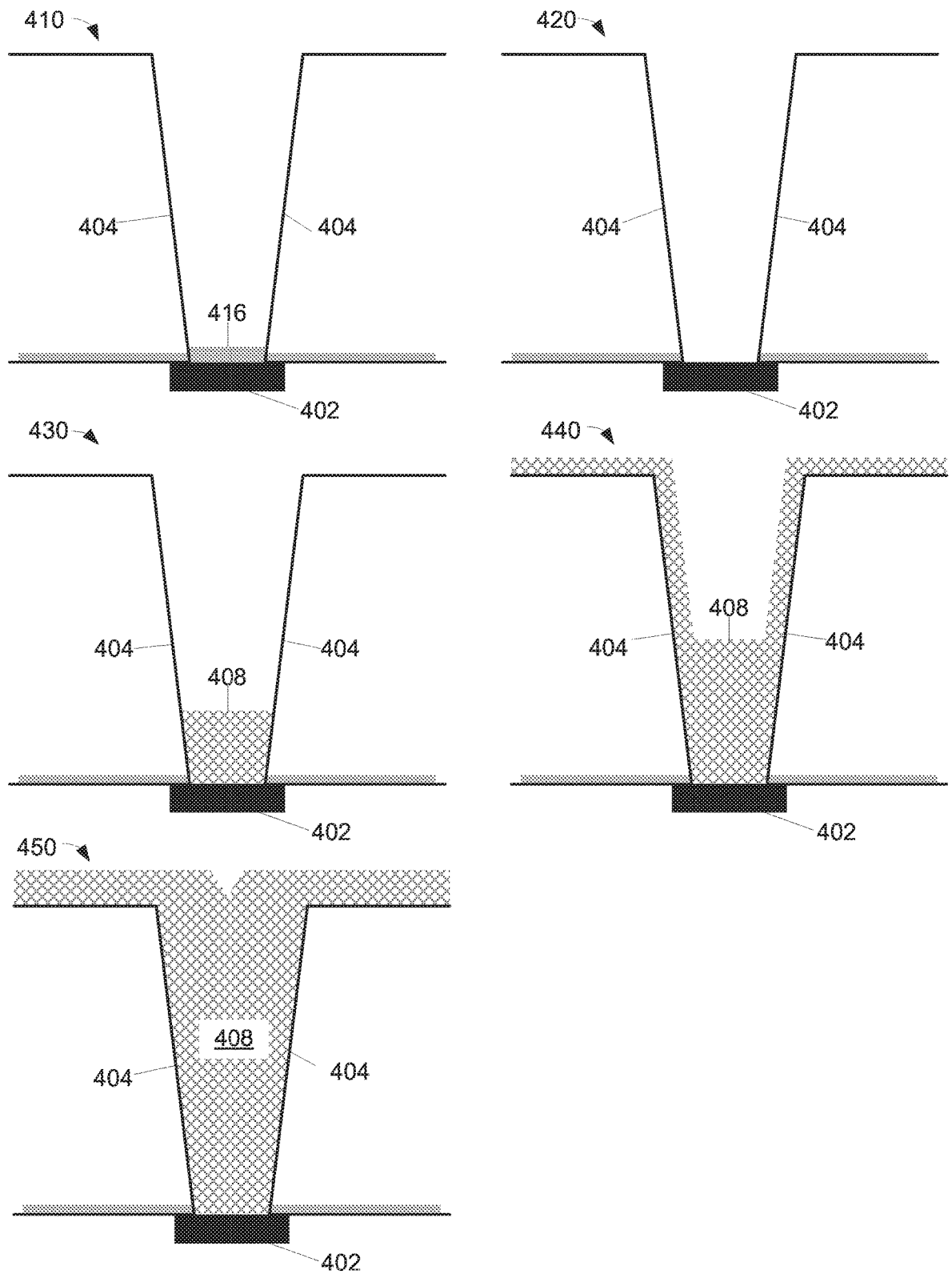
FIG. 4 and FIG. 5 show examples of cross-sectional schematic diagrams of a patterned feature after certain operations of methods according to certain embodiments of FIG. 3.
Figure 5:
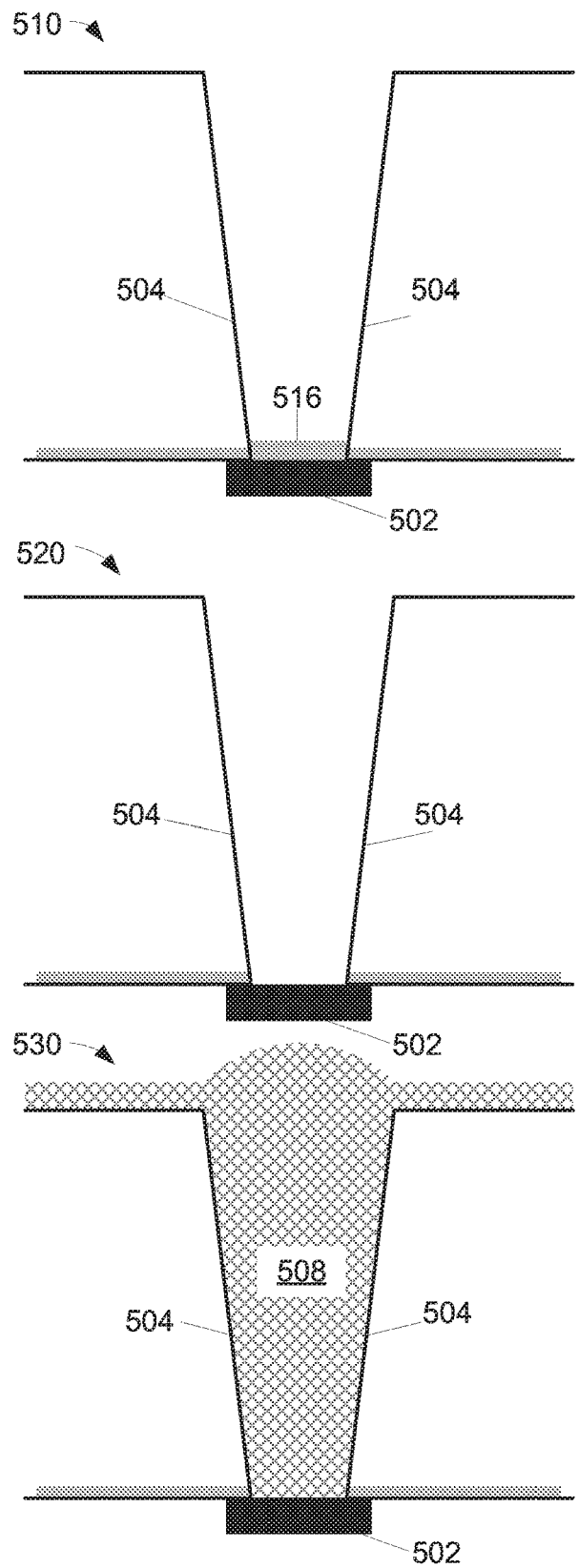

FIG. 3 is a flow diagram showing an example of a selective deposition method 300 to fill a feature with a Mo film. FIG. 4 and FIG. 5 show examples of cross-sectional schematic diagrams of a patterned feature after certain operations of embodiments of the method of FIG. 3. In particular, FIG. 4, at 410, a patterned feature is shown prior to application of the selective deposition method 300. The patterned feature may be, for example, an etched feature. The patterned feature includes bottom surface 402 and sidewall surfaces 404, which may be oxide or nitride. In some embodiments, there may be a metal-oxide 416 on the bottom surface 402.

In FIG. 3, at operation 305, an optional pre-treatment of a feature including a metal-containing surface and a dielectric surface is performed. A pre-treatment may be used to reduce any metal-oxide on the metal-containing surface and thus may include exposing the feature to a reducing agent such as hydrogen species. Pre-treatment of the feature may include exposing the feature to a hydrogen-containing plasma. In some embodiments the hydrogen-containing plasma was generated from hydrogen gas ($H_2$). For some surfaces, an $H_2$-based plasma may not be effective to reduce metal-oxide or otherwise prepare the surface. In such cases, other treatments may be used. In one example, a halogen-based plasma may be used to treat a silicide surface such as a $TiSi_2$ surface. Examples include plasmas generated from chlorine ($Cl_2$) and/or boron trichloride ($BCl_3$).

The pre-treatment, if performed, may be a plasma treatment or, in some embodiments, a thermal treatment. Thermal treatments can involve exposing the surface to a gas in a non-plasma environment. In one example, a hydrogen fluoride (HF) may be used to treat metal silicides such as $TiSi_2$ and other metal compound or metal surfaces. If a plasma treatment is performed, it may be a remote plasma or an in situ plasma. An in situ plasma refers to a plasma that is generated in a chamber that houses the substrate, generally without a filter interposed between the substrate and the generated plasma, and may include ions and radicals. A remote plasma refers to a plasma that is generated remotely from the substrate. It may be generated in a dome or other space that is part of or connected to the chamber the substrate is in or in a separate, self-contained unit. A showerhead or other filter is generally interposed between the generator and the substrate. In some embodiments, a remote plasma contains only radicals or other neutral species, with no ions. In FIG. 4, at 420 is an embodiment of feature 410 after operation 305 is performed. In this embodiment, the metal-containing surface 402 no longer has metal-oxide.

Figure 6A:
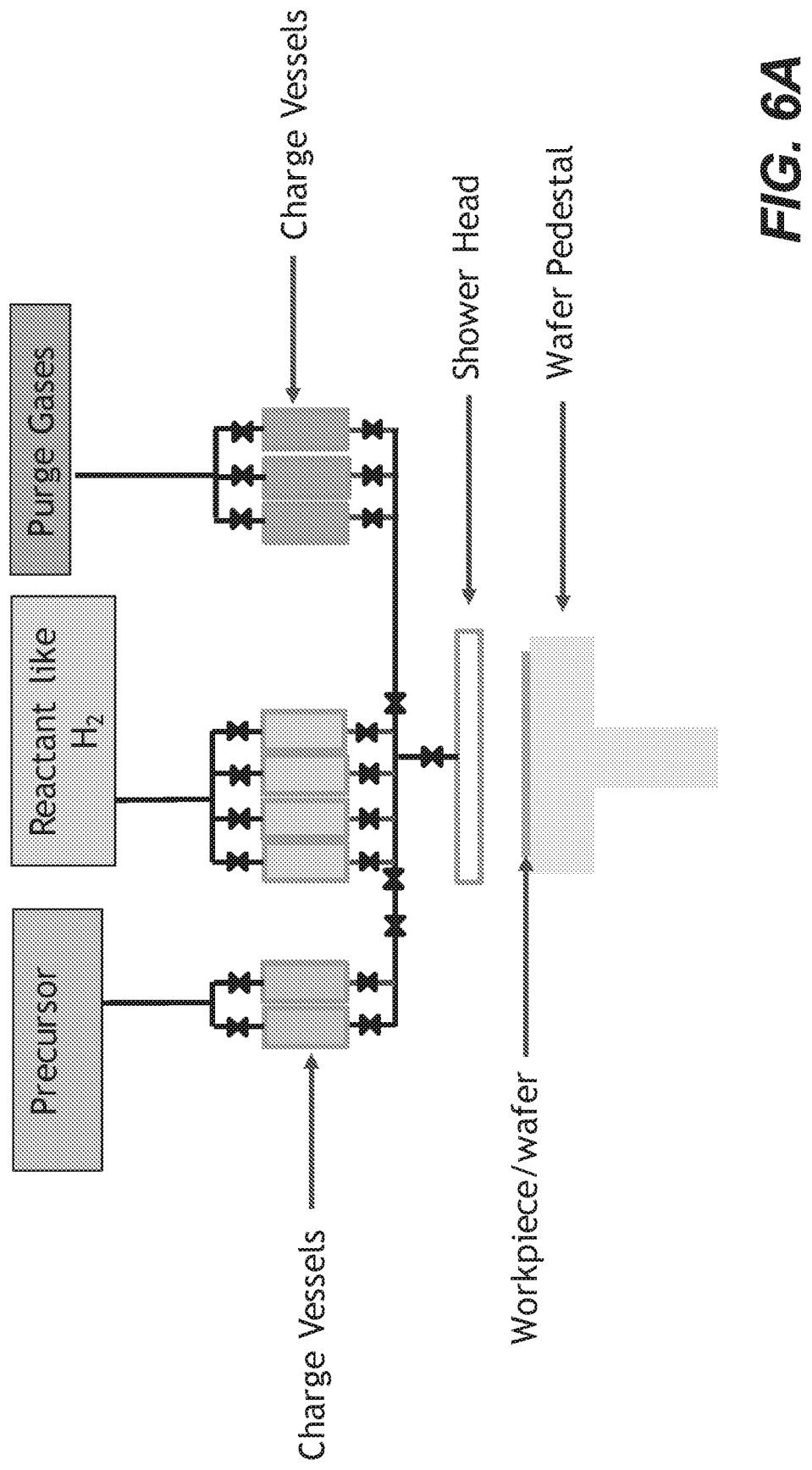
FIG. 6A shows an example of apparatus that include a gas manifold system and that may be employed according to various embodiments.

Returning to FIG. 315, at block 315, selective growth of the Mo film is performed on the metal-containing surface. Selective deposition refers to deposition that is selective to the metal-containing surface with respect to the oxide or nitride surfaces. As such, the portion of the fill that is formed on the metal-containing surface is thicker than that formed on the oxide or nitride surfaces. This is shown in FIG. 4, at 430, which shows the start of the selective deposition of a Mo film 408. The Mo film 408 nucleation starts on the metal-containing bottom surface 402. In the example of FIG. 4, there is no growth of Mo film on the oxide or nitride of the sidewall surfaces 404. The growth on the metal-containing bottom surface 402 may result in larger grain sizes and/or reduced resistance. Selective deposition may be used during ALD (as described in further below with respect to FIG. 6) or chemical vapor deposition (CVD).

To deposit Mo selectively, Mo precursors, temperature, and reactant partial pressure may be controlled. The Mo precursors are oxyhalides, such as $Mo_xO_xH_z$ and H is a halogen (fluorine (F), chlorine (Cl), bromine (Br), or iodine (I)) and x, y, and z being any number greater than zero that can form a stable molecule. Examples of Mo precursors are molybdenum tetrafluoride oxide ($MoOF_4$), molybdenum tetrachloride oxide ($MoOCl_4$), molybdenum dichloride dioxide ($MoO_2Cl_2$), molybdenum dibromide dioxide ($MoO_2Br_2$), and molybdenum oxyiodides $MoO_2I$ and $Mo_4O_{11}I$. A reducing agent reacts with the molybdenum oxyhalide to form elemental molybdenum. In some embodiments, the reducing agent is thermal or plasma hydrogen ($H_2$).

Temperature affects selectivity, grain size, and resistance. Higher temperatures may reduce selectivity of the Mo film and result in growth on the oxide or nitride of the sidewall surfaces 404 as well as on the metal-containing bottom surface 402. However, if temperatures are too low, the impurity level may be increased and grain size may be reduced, increasing resistance. Substrate temperature may be between 350° C. and 600° C., inclusive, to selectively deposit Mo using a chlorine-containing chemistry. As noted above, selectivity can improve as temperature is lowered. Thus, in some embodiments, substrate temperature may be between about 350° C. and 550° C., or 350° C. and 450° C. for a chlorine-containing precursor. Substrate temperatures for a fluorine-containing chemistry may be lower, e.g., 150° C. to 350° C.

At block 325 of FIG. 3, the feature is filled with Mo. A start of the Mo fill process is shown at 430 of FIG. 4. The Mo film 408 may continue to grow on the metal-containing surface 402. At 404, the Mo film may also start to nucleate on the oxide or nitride of the sidewall surfaces 404. The Mo film 408 fills the feature and has a larger thickness from the metal-containing bottom surface 402 than the Mo film 408 grown from the sidewall 404.

In some embodiments, a multi-stage Mo deposition is performed. In FIG. 4, an initial stage is represented at 430 and 440 in which selective deposition is performed. A second stage is represented at 450 in which deposition conditions are changed to increase deposition rate and throughput. At 450, conformal growth (rather than bottom-up, non-conformal growth) occurs. By raising the substrate temperature, the growth rate of the Mo film 408 increases from both the bottom and the sidewall, reducing the time to fill the feature. In the example of FIG. 4, the temperature is raised after some amount of film is nucleated on the sidewall surface. In other embodiments, there may not be any Mo nucleated on some or all of the sidewall surfaces above the portion of the film grown from the bottom-up. Raising the temperature can allow nucleation on these sidewall surfaces. This may be appropriate once the feature has filled sufficiently such that conformal growth can be used to obtain good feature fill without a risk of voids. The temperature may be raised at least 50° C., at least 100° C., or at least 150° C., and may be at least 500° C. and as high as 800° C. as long as the thermal budget is allowed in the device structure.

In some embodiments, the substrate temperature or other process parameters are not changed to increase deposition rate, with the feature filled at the selective deposition conditions. This is illustrated in FIG. 5; at 510, a feature having sidewall surfaces 504 and a bottom surface 502 is shown. A metal-oxide 516 is on the bottom surface 502. At 520, the feature is shown after the metal-oxide is removed. And, at 530, the feature is shown after Mo deposition fills the feature. In a single stage deposition, without a change in process conditions, deposition may remain selective, with bottom-up fill used to fill the feature, or may transition from selective deposition to a more conformal deposition as some Mo begins to nucleate on the sidewalls, reducing the selectivity.

Deposition of pure metal films from oxygen-containing precursors is challenging due to the ease of incorporation of oxygen into the films during the deposition process. If oxygen is incorporated, the resistivity increases. The methods and apparatus described herein may be implemented to deposition pure metal films that have less than 1 atomic percent oxygen in some embodiments. The ratio of the reducing agent to the metal oxyhalide precursor is significantly greater than 1 and the deposited film contains no more than 1 atomic percentage oxygen. Molar ratios of at least 100:1 may be used. In some embodiments, the deposited film has a halogen concentration of no more than 1E18 atoms/$cm^3$. To deposit pure films with no more than one atomic percentage oxygen, the reducing agent to metal precursor ratio is significantly greater than 1, e.g., at least 20:1 or at least 50:1. Examples of temperatures may ranges from 350° C. to 600° C. for chlorine-containing precursors and 150° C. to 500° C. for fluorine-containing precursors. Examples of chamber pressures may range from 1 torr to 100 torr. The reducing agent:precursor ratio used to obtain pure films may be lower as temperature is increased. In some embodiments, the temperature for chlorine-containing precursors is at least 400° C. Higher pressures may also be used to reduce the reducing agent:precursor ratio as the partial pressure of the reducing agent is increased.

For processes such as ALD that employ pulses, the number of reducing agent pulses may be greater than the number of precursor pulses in some embodiments. The methods may be implemented using multiple charging vessels. An example apparatus is shown schematically in FIG. 6A, in which the 3 gas sources (precursor, $H_2$, and purge gases) are connected to charge vessels. The apparatus includes a gas manifold system, which provides line charges to the various gas distribution lines. The manifolds provide the precursor gas, reducing gas and purge gas to the deposition chamber through valved charged vessels. The various valves are opened or closed to provide a line charge, i.e., to pressurize the distribution lines. In various embodiments, the number (a total charge volume) of reducing agent charge vessels may be greater than the number of precursor and/or purge gas charge vessels. Multiple pulses of reducing agent for every one pulse of precursor allows for fast reduction of the oxygen containing precursor to deposit the high purity, low resistivity metal film. In some embodiments, multiple charge vessels may be used for the precursor as well as the reducing agent. This allows multiple pulses to be introduced and enables complete reduction of the oxygen-containing precursors.

The ratio of reducing agent to precursor may be characterized as the ratio of molecules that the substrate is exposed to and are available to react. It may be calculated from:

$$\frac{\text{Reducing agent flow rate} \times \left(\begin{array}{c}\text{Reducing agent line charge time} + \\ \text{Reducing agent dose time}\end{array}\right)}{\text{Precursor flow rate} \times \left(\begin{array}{c}\text{Precursor line charge time} + \\ \text{Precursor dose time}\end{array}\right)}$$

Line charges are pressurized distributions. Dose time refers to the amount of time the dose (also referred to a pulse) lasts. This may be simplified to the below where there is no line charge time:

$$\frac{\text{Reducing agent flow rate} \times \text{Reducing agent dose time}}{\text{Precursor flow rate} \times \text{Precursor dose time}}$$

The above expressions are molar ratios, with example molar ratios ranging from 50:1 to 10000:1, 50:1 to 2000:1, 100:1 to 10000:1, or 100:1 to 2000:1.

The ratio of reducing agent to precursor may be characterized as a volumetric ratio, which may be calculated as Reducing flow rate at showerhead/Precursor flow rate at showerhead The volumetric ratio may be 50:1 to 2000:1, for example.

Figure 6B:
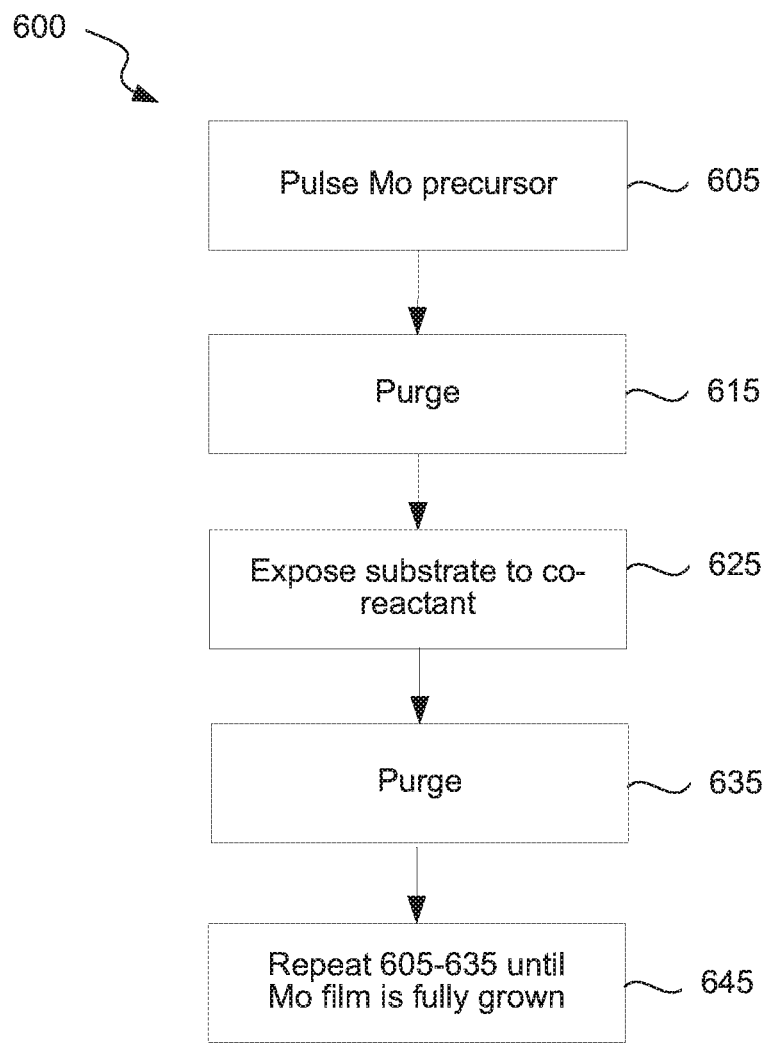
FIG. 6B shows an example of a method of selectively depositing a Mo layer by ALD according to various embodiments.

In some embodiments, an ALD method is used to selectively deposit Mo. FIG. 6B is flow diagram showing operations in an ALD method. At 605, a Mo precursor is pulsed. As discussed above, the Mo precursor is molybdenum-containing oxyhalide precursor, which is adsorbed onto the substrate. After the Mo precursor is pulsed, an optional purge 615 may occur. Argon or any inert gas may be used to purge the chamber of any unadsorbed precursor. The substrate is exposed to a co-reactant 625, which is a reducing agent to reduce the Mo precursor. The reactant may be a hydrogen-containing reactant. In some embodiments, the hydrogen-containing reactant may be thermal hydrogen ($H_2$). A remote or in-situ plasma generated from $H_2$. For thermal (non-plasma) processes, the partial pressure of the co-reactant may be controlled to tune selectivity, with partial pressure at least 10 Torr. Low reactant partial pressure increases the selectivity due to the increase in nucleation delay on dielectrics. Higher pressures may be used with shorter exposure times and lower pressures may be used with longer exposure times. An optional purge may be performed at 635, followed by repeating operations 605-635 until the film is fully grown. As discussed above, this may involve filling the feature completely, and can involve raising the temperature appropriately to move to higher deposition rate process after the film is sufficiently grown from the bottom.

Figure 7:
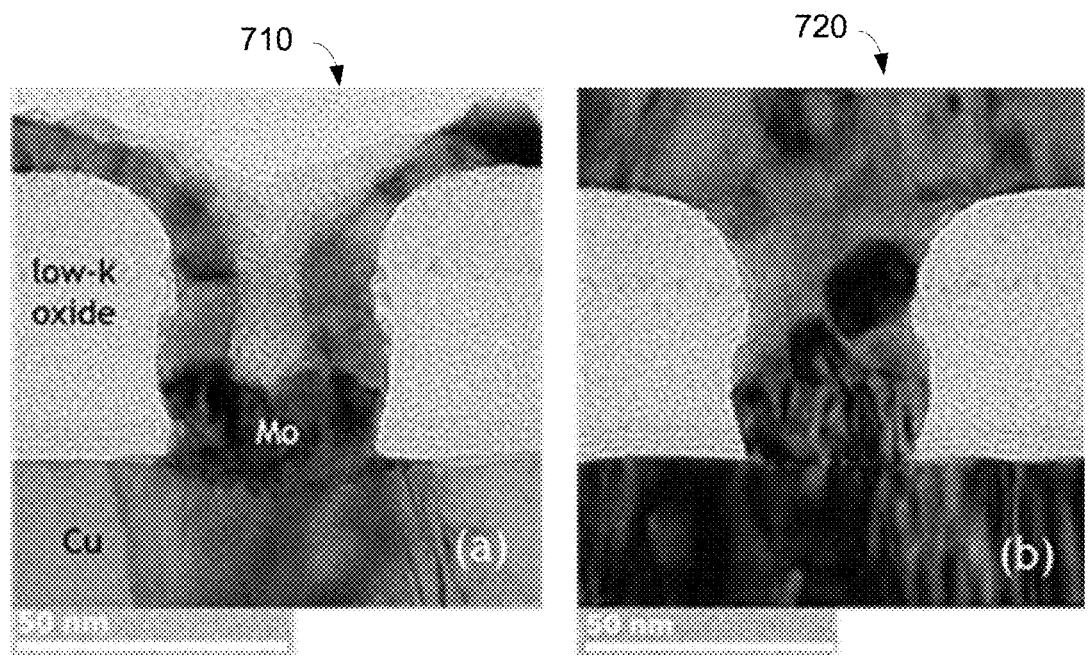
FIG. 7 is an image of Mo gapfill evolution in via structure with a landing on Cu. Image (a) shows selective partial Mo fill and image (b) shows full Mo fill without seams or voids.

FIG. 7 shows transmission electron microscope (TEM) images that shows the results of selective ALD deposition using $MoO_2Cl_2$ at 400° C. Image 710 shows Mo selectively deposited on a Cu surface relate to the oxide sidewalls and image 720 shows the resulting good gapfill.

Apparatus

Figure 8:
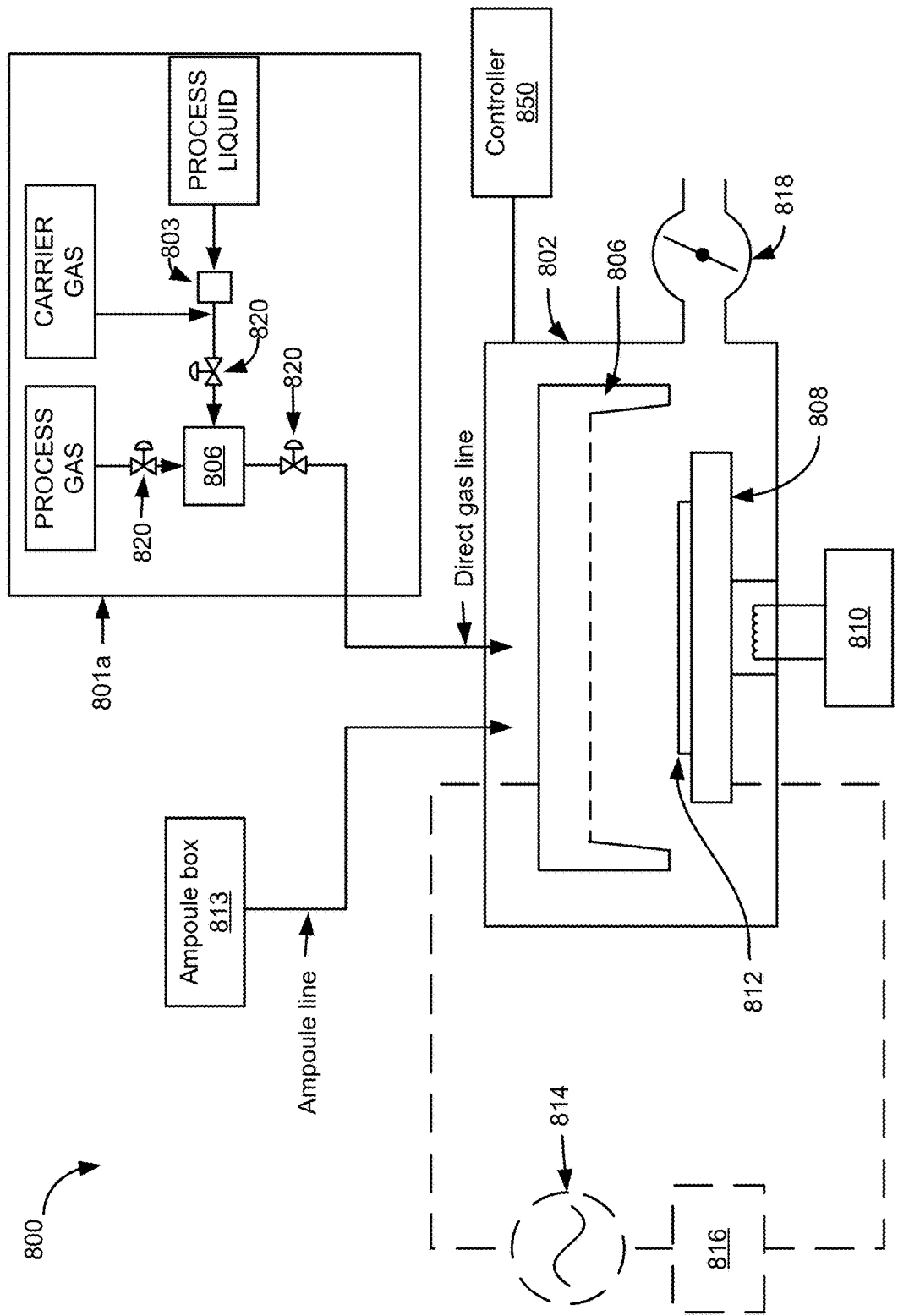
FIG. 8 is a schematic diagram of an example process chamber for performing certain disclosed embodiments.
Figure 9:
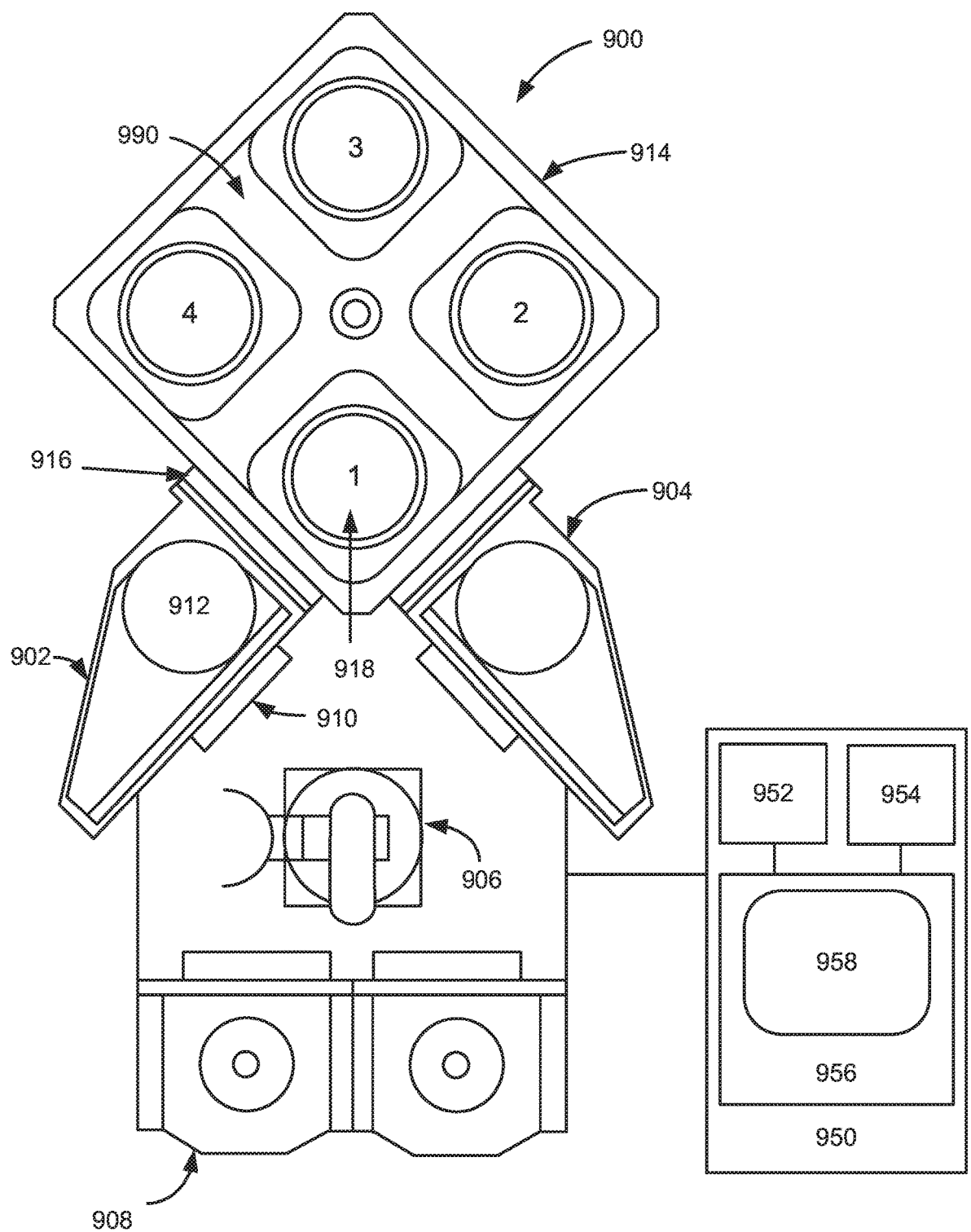
FIG. 9 is a schematic diagram of an example process tool for performing certain disclosed embodiments.

FIG. 8 depicts a schematic illustration of an embodiment of an ALD process station 800 having a process chamber 802 for maintaining a low-pressure environment. A plurality of ALD process stations may be included in a common low pressure process tool environment. For example, FIG. 9 depicts an embodiment of a multi-station processing tool 900. In some embodiments, one or more hardware parameters of ALD process station 800, including those discussed in detail below, may be adjusted programmatically by one or more computer controllers 850.

ALD process station 800 fluidly communicates with reactant delivery system 801a for delivering process gases to a distribution showerhead 806. Reactant delivery system 801a includes a mixing vessel 804 for blending and/or conditioning process gases, such as a Mo precursor-containing gas or hydrogen-containing gas for delivery to showerhead 806. One or more mixing vessel inlet valves 820 may control introduction of process gases to mixing vessel 804. In various embodiments, selective deposition of a Mo film is performed in process station 800 and in some embodiments, other operations such as pre-treatment may be performed in the same or another station of the multi-station processing tool 900 as further described below with respect to FIG. 9.

As an example, the embodiment of FIG. 8 includes a vaporization point 803 for vaporizing liquid reactant to be supplied to the mixing vessel 804. In some embodiments, vaporization point 803 may be a heated vaporizer. In some embodiments, a liquid precursor or liquid reactant may be vaporized at a liquid injector (not shown). For example, a liquid injector may inject pulses of a liquid reactant into a carrier gas stream upstream of the mixing vessel 804. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 803. In one scenario, a liquid injector may be mounted directly to mixing vessel 804. In another scenario, a liquid injector may be mounted directly to showerhead 806.

In some embodiments, a liquid flow controller (LFC) upstream of vaporization point 803 may be provided for controlling a mass flow of liquid for vaporization and delivery to process chamber 802. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 806 distributes process gases toward substrate 812. In the embodiment shown in FIG. 8, the substrate 812 is located beneath showerhead 806 and is shown resting on a pedestal 808. Showerhead 806 may have any suitable shape, and may have any suitable number and arrangement of ports for distributing process gases to substrate 812.

In some embodiments, pedestal 808 may be raised or lowered to expose substrate 812 to a volume between the substrate 812 and the showerhead 806. In some embodiments, pedestal 808 may be temperature controlled via heater 810. Pedestal 808 may be set to any suitable temperature, such as between about 350° C. and about 450° C. during operations for performing various disclosed embodiments. It will be appreciated that, in some embodiments, pedestal height may be adjusted programmatically by a suitable computer controller 850. At the conclusion of a process phase, pedestal 808 may be lowered during another substrate transfer phase to allow removal of substrate 812 from pedestal 808.

In some embodiments, a position of showerhead 806 may be adjusted relative to pedestal 808 to vary a volume between the substrate 812 and the showerhead 806. Further, it will be appreciated that a vertical position of pedestal 808 and/or showerhead 806 may be varied by any suitable mechanism within the scope of the present disclosure. In some embodiments, pedestal 808 may include a rotational axis for rotating an orientation of substrate 812. It will be appreciated that, in some embodiments, one or more of these example adjustments may be performed programmatically by one or more suitable computer controllers 850. The computer controller 850 may include any of the features described below with respect to controller 950 of FIG. 9.

In some embodiments where plasma may be used as discussed above, showerhead 806 and pedestal 808 electrically communicate with a radio frequency (RF) power supply 814 and matching network 816 for powering a plasma. In some embodiments, the plasma energy may be controlled by controlling one or more of a process station pressure, a gas concentration, an RF source power, an RF source frequency, and a plasma power pulse timing. For example, RF power supply 814 and matching network 816 may be operated at any suitable power to form a plasma having a desired composition of radical species. Likewise, RF power supply 814 may provide RF power of any suitable frequency. In some embodiments, RF power supply 814 may be configured to control high- and low-frequency RF power sources independently of one another. Example low-frequency RF frequencies may include, but are not limited to, frequencies between 0 kHz and 900 kHz. Example high-frequency RF frequencies may include, but are not limited to, frequencies between 1.8 MHz and 2.45 GHz, or greater than about 13.56 MHz, or greater than 27 MHz, or greater than 80 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 850 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., the first precursor such as a Mo precursor), instructions for setting a flow rate of a carrier gas (such as argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for modulating a flow rate of a second reactant gas such as $H_2$, instructions for modulating the flow rate of a carrier or purge gas, instructions for igniting a plasma, and time delay instructions for the third recipe phase. A fourth, subsequent recipe phase may include instructions for modulating or stopping a flow rate of an inert and/or a reactant gas, and instructions for modulating a flow rate of a carrier or purge gas and time delay instructions for the fourth recipe phase. It will be appreciated that these recipe phases may be further subdivided and/or iterated in any suitable way within the scope of the present disclosure.

Further, in some embodiments, pressure control for process station 800 may be provided by butterfly valve 818. As shown in the embodiment of FIG. 8, butterfly valve 818 throttles a vacuum provided by a downstream vacuum pump (not shown). However, in some embodiments, pressure control of process station 800 may also be adjusted by varying a flow rate of one or more gases introduced to the process station 800.

As described above, one or more process stations may be included in a multi-station processing tool. FIG. 9 shows a schematic view of an embodiment of a multi-station processing tool 900 with an inbound load lock 902 and an outbound load lock 904, either or both of which may include a remote plasma source (not shown). A robot 906, at atmospheric pressure, is configured to move wafers from a cassette loaded through a pod 908 into inbound load lock 902 via an atmospheric port 910. A wafer (not shown) is placed by the robot 906 on a pedestal 912 in the inbound load lock 902, the atmospheric port 910 is closed, and the load lock inbound 902 is pumped down. Where the inbound load lock 902 includes a remote plasma source, the wafer may be exposed to a remote plasma treatment in the inbound load lock 902 prior to being introduced into a processing chamber 914. Further, the wafer also may be heated in the inbound load lock 902 as well, for example, to remove moisture and adsorbed gases. Next, a chamber transport port 916 to processing chamber 914 is opened, and another robot (not shown) places the wafer into the reactor on a pedestal of a first station shown in the reactor for processing. While the embodiment depicted in FIG. 9 includes load locks, it will be appreciated that, in some embodiments, direct entry of a wafer into a process station may be provided.

The depicted processing chamber 914 includes four process stations, numbered from 1 to 8 in the embodiment shown in FIG. 9. Each station has a heated pedestal (shown at 918 for station 1), and gas line inlets. It will be appreciated that in some embodiments, each process station may have different or multiple purposes. For example, in some embodiments, a process station may be switchable between an ALD and plasma-enhanced ALD process mode. In some embodiments, exposure to a deposition precursor and exposure to a second reactant and plasma are performed in the same station. Additionally or alternatively, in some embodiments, processing chamber 914 may include one or more matched pairs of ALD and plasma-enhanced ALD process stations. Further, exposure to a pre-treatment gas or plasma and an ALD process may occur in the same or different stations. While the depicted processing chamber 914 includes four stations, it will be understood that a processing chamber according to the present disclosure may have any suitable number of stations. For example, in some embodiments, a processing chamber may have five or more stations, while in other embodiments a processing chamber may have three or fewer stations. Still further, in some embodiments, partial gap fill may be performed at first station at a first pedestal temperature with the substrate moved to a second station at a second pedestal temperature.

FIG. 9 depicts an embodiment of a wafer handling system 990 for transferring wafers within processing chamber 914. In some embodiments, wafer handling system 990 may transfer wafers between various process stations and/or between a process station and a load lock. It will be appreciated that any suitable wafer handling system may be employed. Non-limiting examples include wafer carousels and wafer handling robots. FIG. 9 also depicts an embodiment of a system controller 950 employed to control process conditions and hardware states of process tool 900. System controller 950 may include one or more memory devices 956, one or more mass storage devices 954, and one or more processors 952. Processor 952 may include a CPU or computer, analog, and/or digital input/output connections, stepper motor controller boards, etc.

In some embodiments, system controller 950 controls all of the activities of process tool 900. System controller 950 executes system control software 958 stored in mass storage device 954, loaded into memory device 956, and executed on processor 952. Alternatively, the control logic may be hard coded in the controller 950. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 958 may include instructions for controlling the timing, mixture of gases, gas flow rates, chamber and/or station pressure, chamber and/or station temperature, plasma exposure duration, UV radiation duration, wafer temperature, target power levels, RF power levels, substrate pedestal, chuck and/or susceptor position, and other parameters of a particular process performed by process tool 900. System control software 958 may be configured in any suitable way. For example, various process tool component subroutines or control objects may be written to control operation of the process tool components used to carry out various process tool processes. System control software 958 may be coded in any suitable computer readable programming language.

In some embodiments, system control software 958 may include input/output control (IOC) sequencing instructions for controlling the various parameters described above. Other computer software and/or programs stored on mass storage device 954 and/or memory device 956 associated with system controller 950 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 918 and to control the spacing between the substrate and other parts of process tool 900.

A process gas control program may include code for controlling gas composition (e.g., organo-tungsten compound-containing gases, co-reactant gases, gases for performing a pre-treatment, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 950. The user interface may include a display screen, graphical software displays of the apparatus and/or process conditions, and user input devices such as pointing devices, keyboards, touch screens, microphones, etc.

In some embodiments, parameters adjusted by system controller 950 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 950 from various process tool sensors. The signals for controlling the process may be output on the analog and digital output connections of process tool 900. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 950 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 950 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 950.

In some implementations, the system controller 950 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 950, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 950 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 950 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 950, in some implementations, may be a part of or coupled to a computer that is integrated with, coupled to the system, otherwise networked to the system, or a combination thereof. For example, the system controller 950 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 950 receives instructions in the form of data, which specify parameters for each of the processing steps to be performed during one or more operations. It should be understood that the parameters may be specific to the type of process to be performed and the type of tool that the system controller 950 is configured to interface with or control. Thus as described above, the system controller 950 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

While FIGS. 8 and 9 provide examples of chambers and tools that may be used to perform the methods disclosed herein, various modifications may be made. These include the use of any CCP or ICP plasma generator or the use of a remote plasma generator.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 950 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
providing a substrate comprising a feature having a feature bottom and feature sidewalls, wherein the feature bottom comprises a metal or metal nitride surface and the feature sidewalls comprise oxide surfaces; and
performing multiple cycles of an atomic layer deposition (ALD) process to selectively deposit a molybdenum (Mo) film on the metal or metal nitride surface relative to the oxide surfaces, wherein the ALD process comprises exposing the feature to alternate pulses of molybdenum-containing oxyhalide precursor and a reducing agent at a first substrate temperature, further comprising, partially filling the feature while the substrate is at the first substrate temperature, and completely filling the feature while the substrate is at a second substrate temperature, the second substrate temperature being greater than the first substrate temperature.

2. The method of claim 1, wherein the partially filling takes place in a first station of a process chamber, and the completely filling takes place at a second station of the process chamber.

3. The method of claim 1, further comprising, prior to performing the multiple cycles of the ALD deposition process, exposing the metal or metal nitride surface to a hydrogen-containing plasma.

4. The method of claim 1, wherein the reducing agent is thermal hydrogen ($H_2$).

5. The method of claim 1, wherein the reducing agent is provided in a plasma generated from hydrogen ($H_2$).

6. The method of claim 1, wherein the partial pressure of the reducing agent is at least 10 Torr.

7. The method of claim 1, wherein the molybdenum-containing oxyhalide precursor is a molybdenum oxychloride.

8. The method of claim 7, wherein the first substrate temperature is no more than 600° C.

9. The method of claim 8, wherein the first substrate temperature is at least 350° C.

10. The method of claim 7, wherein the first substrate temperature is no more than 450° C.

11. The method of claim 7, wherein the first substrate temperature is no more than 400° C.

12. The method of claim 1, wherein the molybdenum-containing oxyhalide precursor is a molybdenum oxyfluoride.

13. The method of claim 1, wherein the metal or metal nitride surface is one of a material from a group consisting of:
cobalt, ruthenium, copper, tungsten, molybdenum, titanium, tin, tantalum, nickel, iridium, and rhodium.

14. The method of claim 1, wherein the metal or metal nitride surface is one of a material from a group consisting of:
titanium nitride, molybdenum nitride, tungsten nitride, tungsten carbon nitride, and tantalum nitride.

15. The method of claim 1, wherein the metal or metal nitride surface is an elemental metal surface.

16. The method of claim 1, wherein the feature sidewalls comprise an oxide selected from:
polyethyleneoxide, tetraethyl orthosilicate, flowable oxide, and a carbon doped oxide.

17. The method of claim 1, wherein the Mo film on the metal or metal nitride surface is at least about 20 Å thicker than the Mo film on the oxide surfaces of the feature sidewalls.

18. A method comprising:
providing a substrate comprising a feature having a feature bottom and feature sidewalls, wherein the feature bottom comprises a metal or metal nitride surface and the feature sidewalls comprise oxide surfaces; and
performing a deposition process to selectively deposit a molybdenum (Mo) film on the metal or metal nitride surface relative to the oxide surfaces, wherein the deposition process comprises exposing the feature to a molybdenum-containing oxyhalide precursor and a reducing agent at a first substrate temperature further comprising, partially filling the feature while the substrate is at the first substrate temperature, and completely filling the feature while the substrate is at a second substrate temperature, the second substrate temperature being greater than the first substrate temperature.

* * * * *